(12) United States Patent
Rheinfelder et al.

(10) Patent No.: US 8,300,724 B2
(45) Date of Patent: Oct. 30, 2012

(54) DIGITAL TRANSCEIVER

(75) Inventors: Clemens Rheinfelder, Blaustein (DE); Werner Korte, Ulm (DE); Ingeborg Sigrid Ilse-Dore Korte-Gericke, legal representative, Eschwege (DE)

(73) Assignee: Ubidyne, Inc., Wilmington, DE (US)

( * ) Notice: Subject to any disclaimer, the term of this patent is extended or adjusted under 35 U.S.C. 154(b) by 717 days.

(21) Appl. No.: 12/339,293

(22) Filed: Dec. 19, 2008

(65) Prior Publication Data

US 2009/0252206 A1 Oct. 8, 2009

Related U.S. Application Data

(63) Continuation-in-part of application No. PCT/EP2007/006335, filed on Jul. 17, 2007.

(60) Provisional application No. 60/807,512, filed on Jul. 17, 2006.

(30) Foreign Application Priority Data

Jul. 17, 2006 (GB) .................................. 0614294.7

(51) Int. Cl.
*H04L 27/00* (2006.01)
(52) U.S. Cl. ........ 375/295; 375/219; 375/298; 375/320; 341/143
(58) Field of Classification Search .................... 375/219
See application file for complete search history.

(56) References Cited

U.S. PATENT DOCUMENTS

| 5,524,090 | A | * | 6/1996 | Iwamura | 708/625 |
|---|---|---|---|---|---|
| 5,818,883 | A | | 10/1998 | Smith et al. | |
| 6,611,570 | B1 | | 8/2003 | Subramanian | |
| 6,771,710 | B1 | | 8/2004 | Myers | |
| 7,167,514 | B2 | * | 1/2007 | McElroy et al. | 375/229 |
| 7,912,158 | B2 | * | 3/2011 | Cahn et al. | 375/345 |
| 2004/0036638 | A1 | * | 2/2004 | Lipka | 341/143 |
| 2004/0196899 | A1 | * | 10/2004 | Zhou et al. | 375/238 |
| 2005/0201494 | A1 | | 9/2005 | Yoon | |
| 2005/0215213 | A1 | | 9/2005 | Toporski | |

(Continued)

FOREIGN PATENT DOCUMENTS

EP 1429231 6/2004

(Continued)

OTHER PUBLICATIONS

Japanese Notification of Reasons for Refusal issued in 2009-519865 on Jan. 24, 2012 (and translation).

*Primary Examiner* — Lihong Yu
(74) *Attorney, Agent, or Firm* — Stephen H. Eland; Dann, Dorfman, Herrell & Skillman

(57) ABSTRACT

Digital Transceiver (DTRX) usable in a radio communications systems for transmitting and receiving digital base-band signals, wherein the DTRX (300) comprises: at least one digital up-converter (DUC) (310) for transmitting digital base-band signals and at least one digital down-converter for receiving digital base-band signals. In one aspect of the teachings disclosed herein the DUC (310) comprises at least two over-sampling units (314, 315), at least one quadrature modulation unit (340), and at least one time-discrete sigma delta band-pass modulator (318). The digital down-converter comprises at least one quadrature demodulation unit (360), at least two decimator units (356,357), and at least two sub-sampling units (354, 355). The digital base-band signal comprises an in-phase component (I-signal) and a quadrature component (Q-signal).

9 Claims, 16 Drawing Sheets

U.S. PATENT DOCUMENTS

2006/0083335 A1    4/2006   Seendripu et al.

FOREIGN PATENT DOCUMENTS

| | | |
|---|---|---|
| JP | 2000-68839 | 3/2000 |
| JP | 2002-501319 | 1/2002 |
| JP | 3945538 | 4/2007 |
| WO | 96/21288 | 7/1996 |
| WO | 99/35746 | 7/1999 |
| WO | 2004/043030 | 5/2004 |
| WO | 2005/120001 | 12/2005 |

\* cited by examiner

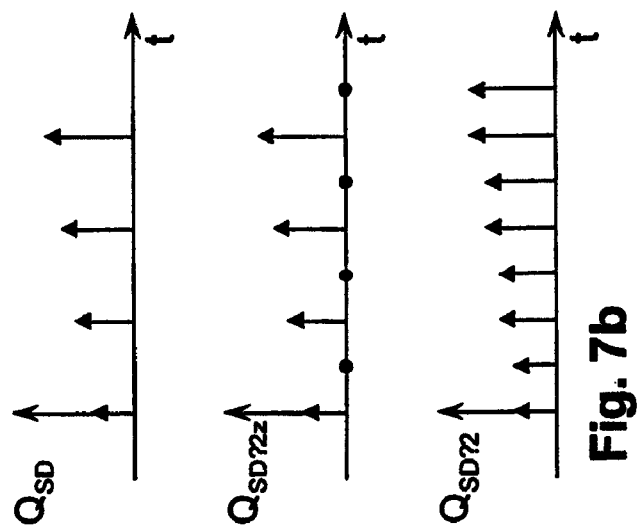
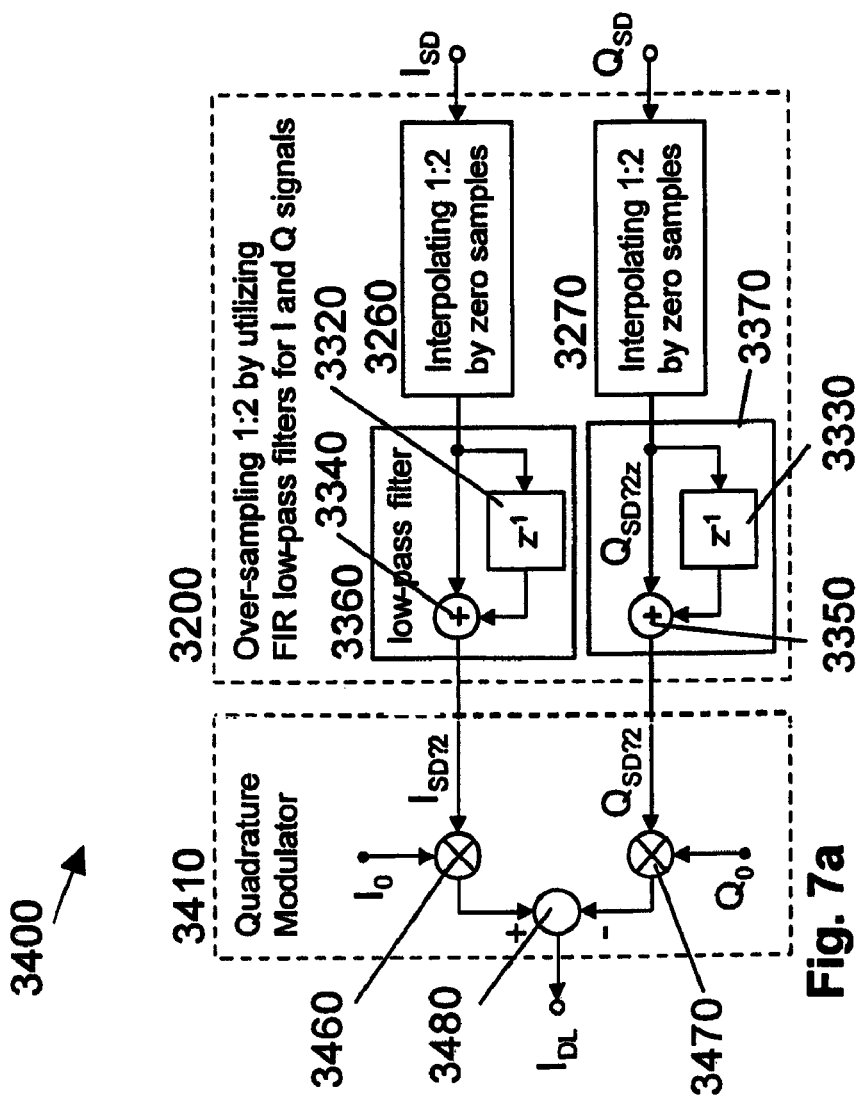
Fig. 7a
Fig. 7b

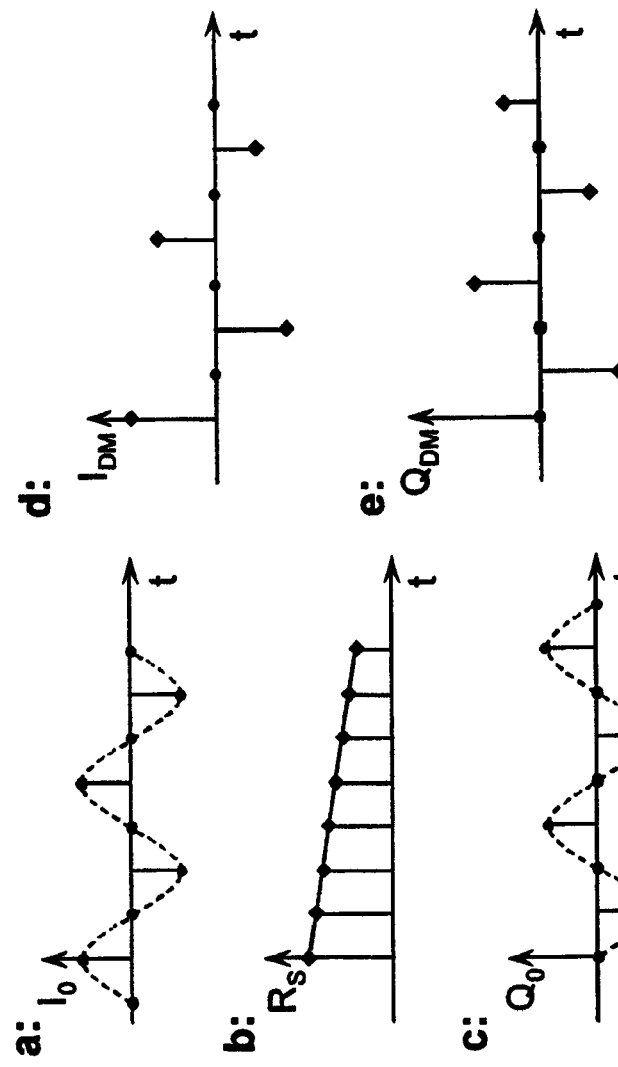
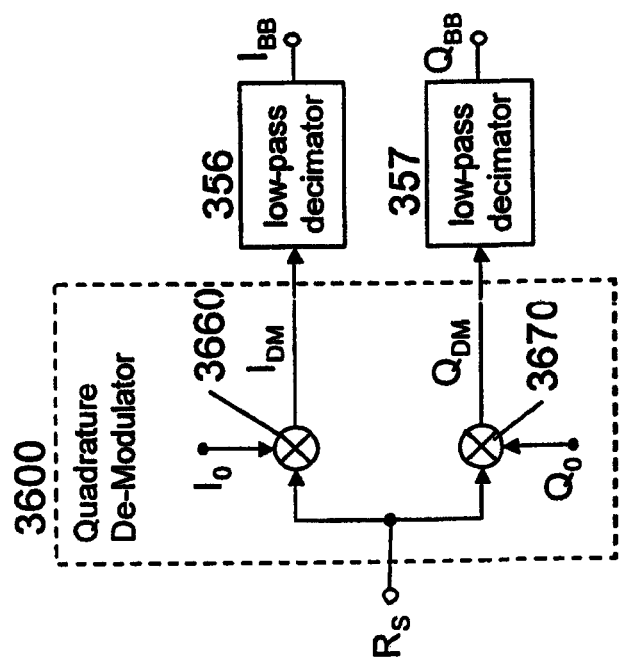
Fig. 11
Fig. 10

DIGITAL TRANSCEIVER

RELATED APPLICATIONS

This application is a continuation-in-part of International Application No. PCT/EP2007/006335, filed 17 Jul. 2007, which claims priority of U.S. provisional application No. 60/807,512, filed 17 Jul. 2006, and of UK patent application no. 0614294.7, filed 17 Jul. 2006. The entire disclosure of each of the foregoing applications is incorporated herein by reference.

FIELD OF THE INVENTION

The present application relates to radio transceivers and antenna systems. In particular, the present application relates to base transceiver stations and digital transceivers for radio communications systems.

BACKGROUND

Radio communication technology has greatly advanced in recent years, as evident by the high performance digital mobile phones currently available. Mobile communication has been made available with almost 100% coverage area in many regions of the world following the demand of the users. Users wish to be able to communicate via their mobile phone (mobile stations) from anywhere they are.

As a consequence, the number of mobile stations and the number of communications links established is increasing. In addition, the amount of data transferred over a communication link is steadily increasing as it is not only desired to transfer voice messages or short messages with high quality but also increasing amounts of data, i.e. for images, movies or music etc.

In order to be reachable, a base transceiver station (BTS) has to be within the range of the mobile station. A communications link is then established between the mobile station and the BTS in which communications data are sent and received from the mobile stations and the BTS by an RF signal. The BTS transfers the communications data further into telephony or other communication networks.

Mobile service providers have to ensure that their clients can have access to a BTS almost everywhere they are. Therefore BTSs have to be distributed in order to achieve a high coverage area. In addition, a sufficient number of BTS has to be installed in urban areas in which large numbers of mobile communication have to be performed concurrently.

Modern BTS have to cover a wide frequency bandwidth and a high dynamic range.

In order to provide good access, antennas of BTS are usually placed in exposed places such as roof tops, tower tops or on masts, so that they are not shielded by walls or the landscape itself and the area covered can be maximized.

DESCRIPTION OF THE RELATED ART

Base transceiver stations (BTS) known in the art usually comprise tower-top equipment and a base station.

The tower-top equipment mainly consists of a plurality of antenna elements forming an antenna that is mounted on exposed places such as roof tops, masts or the like, whereto and from which the RF signal can be transmitted to the mobile station with as few barriers as possible. When mounted exposed, antennas can also be widely seen. This, however, is not always wanted and frequently raises concerns with residents living close to the antennas.

The antennas of the tower-top equipment known in the prior art are connected to radio units for transceiving the RF signals via the antenna elements of the antenna. The radio units serve as converters of RF signals into a digital base-band signal and are usually located together with further electronic equipment necessary for the BTS in a base station. At present the base station requires a considerable amount of space, usually of the size of a small room. This room or container may be located in the basement or on the roof of the building on which the antenna is mounted. The base station and the radio unit are at some distance from the antenna, thus requiring a connection between them.

The radio unit and the antenna elements are connected with coaxial cables in order to shield them from electrical noise as far as possible. These coaxial cables are at present about 10-50 m in length because of the distance between the antenna and the radio unit. The cable length has the inherent disadvantages of energy and signal to noise loss. The coaxial cable often runs along the outside of the building and is as a result unsightly.

U.S. Pat. No. 6,611,570 B1 discloses digital up and down converters as well as digital transceivers. For example, the programmable digital intermediate frequency receiver disclosed in U.S. Pat. No. 6,611,570 B1 includes a programmable memory, a clock generator, a sigma-delta converter, a digital downconverter, and a decimation filter network. The entire disclosure of U.S. Pat. No. 6,611,570 B1 is hereby incorporated into the description by reference.

The international patent application WO 2004/043030 A1 describes a radio transceiver with digital up converters for the transmission portion and digital down converters for the receive portion of the transceiver. The transceiver further comprises analogue-to-digital converters, digital-to-analogue converters, and RF units. The RF units are of analogue design and serve the purpose to up convert (down convert) a signal to (from) carrier frequency range. Up conversion and down conversion of digital signals is performed between base-band frequency and an intermediate frequency. The entire disclosure of WO 2004/04303 A1 is hereby incorporated into the description by reference.

The European Patent Application EP 1 429 231 A1 shows a digital down converter and a digital up converter using a numerical control oscillator. The digital down converter includes a decimator for reduce the sampling frequency. The digital up converter includes an interpolator for multiplying the sampling frequency. The numerical control oscillator provides a relatively accurate digital representation of a sine signal or a cosine signal in order to enable the up/down converter to mimic the behaviour of an analogue frequency mixer. The entire disclosure of EP 1 429 231 A1 is hereby incorporated into the description by reference.

The international patent application WO 2005/120001 A3 describes a fully digital transmitter including a digital bandpass sigma-delta modulator. The transmitter includes digital up-converter functions that operate in combination with a digital band-pass sigma-delta modulator to generate modulated digital signals at a sample frequency that is a multiple of the transmit frequency. This arrangement requires the sigma-delta modulator to function at the multiple of the transmit frequency, i.e. the sigma-delta modulator is operated at a relatively high frequency. The entire disclosure of WO 2005/120001 A3 is hereby incorporated into the description by reference.

Therefore, a system is required that minimizes or avoids the electrical losses of the RF signal.

There is also a need for a BTS that requires less space and that is easier to install and maintain.

SUMMARY OF THE INVENTION

It is therefore an object of the teachings disclosed herein to provide a base transceiver station that avoids the use of coaxial cables for transferring a signal.

It is an object of the teachings disclosed herein to provide an up converter for the use in a digital radio unit.

It is another object of the teachings disclosed herein to provide a down-converter for the use in a digital radio unit.

It is furthermore an object of the teachings disclosed herein to provide to provide a transceiver for the use in a digital radio unit.

It is another object of the teachings disclosed herein to provide a fast transceiver with low space requirements.

It is further object of the teachings disclosed herein to provide a digital radio unit that can be installed at the tower top equipment of a BTS in close proximity of the antenna.

It is yet a further object of the teachings disclosed herein to provide a digital radio-unit for an all-digital antenna.

These and other objects of the teachings disclosed herein are solved by digital Up-Converter (DUC) usable in a radio communications systems for transmitting digital base-band signals to up-convert an incoming digital base-band signal into a digital band-pass signal ($I_{DL}$), the digital base-band signal comprising an in-phase component (I-signal) and a quadrature component (Q-signal). The digital band-pass signal ($I_{DL}$) may be available at an output. The digital up converter comprises:

at least two over-sampling units (314, 315) each comprising a plurality of FIR low-pass filters connected to a sample and hold circuit to over-sample the incoming I-signal and Q-signal at an over-sampling ratio of $1/2N_T$, wherein $1/2N_T$ is an arbitrary integer;

at least two time-discrete sigma-delta low-pass modulators (316, 317) connected to the over-sampling units (314, 315) to convert the over-sampled I-signal and Q-signal into a single/1.5 bit format;

at least one quadrature modulation unit (340) to convert the incoming I-signal and Q-signal in single/1.5 bit format into a digital band-pass signal ($I_{DL}$) available in single/1.5 bit format at the output of the DUC (310).

The radio communication system can also be a sub-system of the radio communications system. In a particular application, the radio communications system is a mobile communications system.

The quadrature modulation may be performed by 2:1 multiplexing and cyclic negation of the incoming I-signal and Q-signal in single/1.5 bit format.

In one aspect of the teachings disclosed herein, the digital Up-Converter (DUC) comprises: at least two SerDes Decoder and Buffer stages for receiving the I-signal and the Q-signal via at least two serial links in a packet data frame format, for converting said signals into at least two parallel synchronous data streams each in the same parallel data format for further processing, and for providing the two parallel synchronous data streams to the over-sampling units.

In an alternative aspect of the teachings disclosed herein, the digital Up-Converter (DUC) comprises: at least one SerDes Decoder and frame buffer plus de-multiplexer stage to receive via at least one serial link an I-signal and a Q-signal being interlaced in a packet data frame format and further to de-multiplex and convert said signals into at least two parallel synchronous data streams each in the same parallel data format for further processing, and to provide the two parallel synchronous data streams to the over-sampling units.

The quadrature modulation may be performed by 2:1 multiplexing and cyclic negation of the over-sampled I-signal and Q-signal.

In a further aspect, the time-discrete sigma-delta band-pass modulator is realized as a systolic array.

In an alternative aspect the Digital Up-Converter (DUC) comprises:

at least two over-sampling units each utilizing a combination of FIR low-pass filters connected to a sample and hold circuit to over-sample the incoming I-signal and Q-signal at an over-sampling ratio of $1/2N_T$, wherein $1/2N_T$ is an arbitrary integer;

at least one quadrature modulation unit for converting the over-sampled I-signal and Q-signal into a digital band-pass signal in parallel data format;

at least one time-discrete sigma-delta band-pass modulator connected to the at least one quadrature modulation unit (340) to convert the digital band-pass signal in parallel data format into a digital band-pass signal ($I_{DL}$) available in single/1.5 bit format at the output of the DUC.

The quadrature modulation may be performed by 2:1 multiplexing and cyclic negation of the over-sampled I-signal and Q-signal.

The digital Up-Converter may further comprise at least one SerDes Decoder and frame buffer plus de-multiplexer stage to receive via at least one serial link an I-signal and a Q-signal being interlaced in a packet data frame format and further to de-multiplex and convert said signals into at least two parallel synchronous data streams each in the same parallel data format for further processing.

The digital Up-Converter may further comprise at least two SerDes Decoder and Buffer stages for receiving an I-signal and a Q-signal via at least two serial links in a packet data frame format and for converting said signals into at least two parallel synchronous data streams each in the same parallel data format for further processing.

The at least one time-discrete sigma-delta band-pass modulator may be realized as a systolic array.

In yet a further aspect, the at least one quadrature modulation unit for performing quadrature modulation by 2:1 multiplexing and cyclic negation is the at least one quadrature modulation unit being realized in a pipelined structure by using only 2:1 multiplexers, logic AND and EXOR gates, and flip-flops.

The DUC may utilize a multi-bit format of the digital band-pass signal ($I_{DL}$). The DUC may utilize as parallel data format a 16 bit format.

The DUC may be monolithically micro-electronically integrated or integrated as a multi-chip module.

The objects of the teachings disclosed herein are also solved by an Digital Down-Converter (DDC) usable in a radio communications systems for receiving digital base-band signals to down-convert at least one incoming digital band-pass signal ($R_S$) into a digital base-band signal, the digital base-band signal comprising an in-phase component (I-signal) and a quadrature component (Q-signal). The digital Down Converter (DDC) comprises at least one quadrature demodulation unit (for converting the at least one incoming digital band-pass signal ($R_S$) in single/1.5 bit format into an I-signal and a Q-signal in single/1.5 bit format being 2:1 sub-sampled; at least two decimator units connected to the at least one quadrature demodulation unit each utilizing a FIR decimator to convert the incoming I-signal and Q-signal in single/1.5 bit format into a sub-sampled parallel data format by applying a sub-sampling ratio of $1/4N_R$ being an arbitrary integer; at least two sub-sampling units connected to the decimator units each utilizing a FIR low-pass filter to further sub-sample the I-signal and Q-signal in parallel data format by a sub-sampling ratio of 2.

The digital Down-Converter may further comprise at least two SerDes Encoder and Buffer stages connected to the sub-sampling units for converting each sub-sampled I-signal and Q-signal incoming in the same parallel data format into a serial packet data frame format and to transmit said signals in packet data streams via at least two serial links connected to an output of the DDC.

In an alternative aspect of the teachings disclosed herein, the DDC comprises at least one Multiplexer and Buffer plus SerDes Encoder stage connected to the sub-sampling units for interlacing the samples of the sub-sampled I-signal and Q-signal incoming in the same parallel data format into a multiplexed I/Q signal format and for converting said I/Q signal format into a serial packet data frame format and for transmitting the multiplexed I/Q signals in a serial packet data stream via at least one serial link connected to an output of the DDC.

The at least one quadrature demodulation unit may perform quadrature demodulation by 1:2 demultiplexing and cyclic negation.

In one aspect of the teachings disclosed herein, the at least one quadrature demodulation unit performing quadrature demodulation by 1:2 de-multiplexing and cyclic negation is realized in a pipelined structure by using only 1:2 de-multiplexers, logic AND and EXOR gates, and flip-flops.

In an aspect of the digital Down-Converter (DDC), the decimator units are realized each as an array of M Digital Down-Converter (DDC) blocks followed by a pipelined cascade of parallel adder stages whilst the incoming digital band-pass signal ($R_S$) in single/1.5 bit format is distributed to the M inputs of the DDC blocks by an array of bi-serial shift registers, wherein M is an arbitrary integer.

The digital Down-Converter (DDC) blocks can also be realized each as a systolic array being structured in parallel bit-slices connected to an output storage register, whereby said bit-slices each comprises a FIR coefficients revolver for one bit followed by a 1×1.5 bit multiplier further connected to a synchronously cleared accumulator and connected to a sub-sample & hold stage, whereby said bit-slices are realized by using only 2:1 multiplexers, one-bit full adders, logic AND and EXOR gates and flip-flops.

In an aspect of the teachings disclosed herein, at least one digital up-converter (DUC) and at least one digital down-converter (DDC) form a digital transceiver (DTRX) usable in a radio communications system for transmitting and receiving digital base-band signals.

In an aspect, the DDC, the DUC, or the DTRX are realized as systolic arrays.

In a further aspect, the DDC, the DUC, or DTRX utilize a multi-bit format of the digital band-pass signal ($I_{DL}$). The multi-bit format may be 16-bit format.

In one aspect of the teachings disclosed herein, the DUC, the DDC or the DTRX are integrated in a micro-radio of a digital radio unit. The DUC, the DDC, or the DTRX can be monolithically micro-electronically integrated or can be integrated as a multi-chip module. The Integration can be realized by micro-electronic means.

It is obvious to a person skilled in the art that the DUC, DDC or the DTRX according to the teachings disclosed herein can be applied in any radio communications systems and that the teachings disclosed herein are not limited to mobile communications systems. The teachings disclosed herein may be applied in transceiver, transmitter, or receiver units according to the requirements of the particular radio communications system.

The teachings of this application are also directed to a computer-program product embodied on a computer-readable medium and comprising executable instructions for the manufacture of the digital up-converter, the digital down-converter, and the digital transceiver.

These and other aspects of the digital up-converter, the digital down-converter, the digital transceiver or computer-program product will be apparent from and elucidated with reference to the embodiment(s) described herein after.

DESCRIPTION OF THE DRAWINGS

The features of what is disclosed herein may be better understood when reading the detailed description and the figures, wherein identical numbers identify identical or similar objects.

FIG. 4b shows an example of the data frame format used between the μ-radio and the C-Hub in FIG. 4a.

FIG. 7a shows the block diagram of a generic digital quadrature modulator with 1:2 over-sampling pre-stage having the identical functionality as the quadrature modulation by multiplexing and cyclic negation block of the DUC of FIG. 5.

FIG. 7b shows illustrative examples of signals of the generic digital quadrature modulator with 1:2 over-sampling pre-stage of FIG. 7a.

FIGS. 8a-8i show examples of signals at different lines of the digital quadrature modulator in in-phase version shown in FIG. 7a.

FIG. 10 shows the structure of a generic digital quadrature de-modulator followed by low-pass decimators having together the identical functionality as the quadrature de-modulation by de-multiplexing and cyclic negation block and low-pass decimators of the DDC of FIG. 5.

FIG. 11 shows illustrative examples of signals at different lines of FIG. 10.

DETAILED DESCRIPTION

Figure 1:
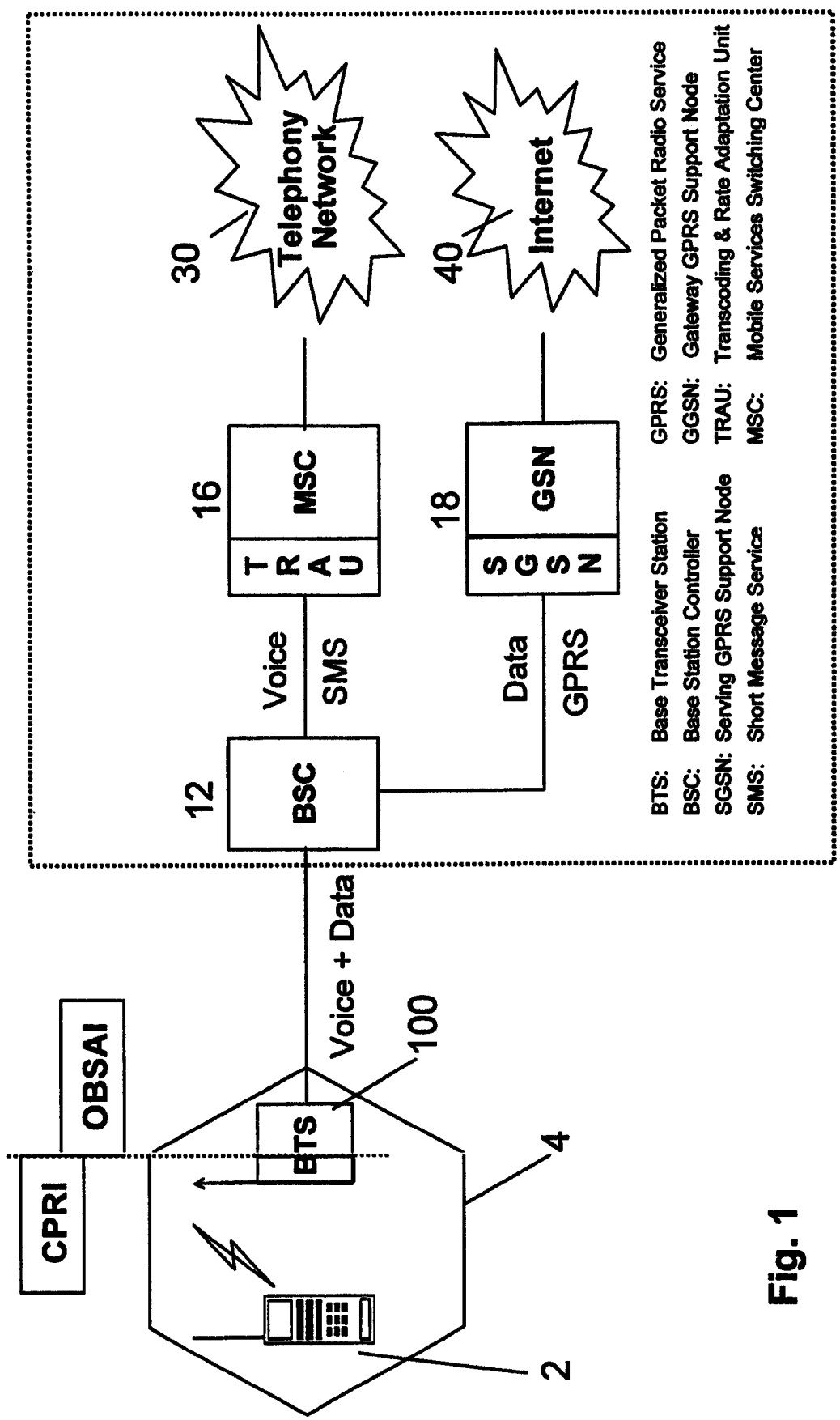
FIG. 1 shows a mobile communications network

FIG. 1 shows an overview of a mobile communications network. A mobile station 2 can communicate via radio links with a base transceiver station (BTS) 100 when the mobile station 2 is within the range 4 of the BTS 100. A mobile station 2 is any mobile or immobile communication device that enables communication via radio links, usually at radio frequencies (RF) in the range of 800 MHz up to several GHz. Common examples for mobile stations are, but are not limited to, mobile telephones, pocket PC, data cards etc.

If a mobile station 2 is in the range of the BTS 100 data communication may be established between the mobile station 2 and the BTS 100. The data communication may be used to transfer voice and/or data. During communication the BTS 100 sends RF signals that are received by the mobile station 2 via a radio downlink and receives RF signals sent by the mobile station 2 via a radio uplink. In the Frequency Division Duplex (FDD) mode two different frequency bands are utilized to separate the radio downlink from the radio uplink. In the Time Division Duplex (TDD) mode, however, only one frequency band is used in both directions downlink and uplink. The separation is performed in the time domain by using the same frequency band alternately in downlink and uplink direction. Thus, in TDD mode the antenna plus bandpass filter is periodically switched either to the transmit path or to the receive path. Both modes are utilized in different mobile radio standards, although FDD is more widespread than TDD.

From the BTS 100, data (which includes data communication data and voice data) are transferred to a base station controller 12. The base station controller (BSC) 12 separates voice data and data communication data and sends the voice data and the SMS data to a mobile switching centre (MSC) 16 from which the voice data and the SMS data are further transferred to a telephony network 30 to which the MSC 16 is linked. Other data are sent by the BSC 12 to a Serving and Gateway GPRS Support Node (GSN) 18 and are further transferred to a data network 40, such as the Internet. It is understood that all communications flow may be in both directions. Data are also sent from the data network 40 and/or the telephony network 30 in the opposite direction to the BTS 100 from which the data are sent by radio waves as RF signal to the mobile station 2. Several mobile stations 2 may be communicating with a single BTS 12 at the same time.

Figure 2:
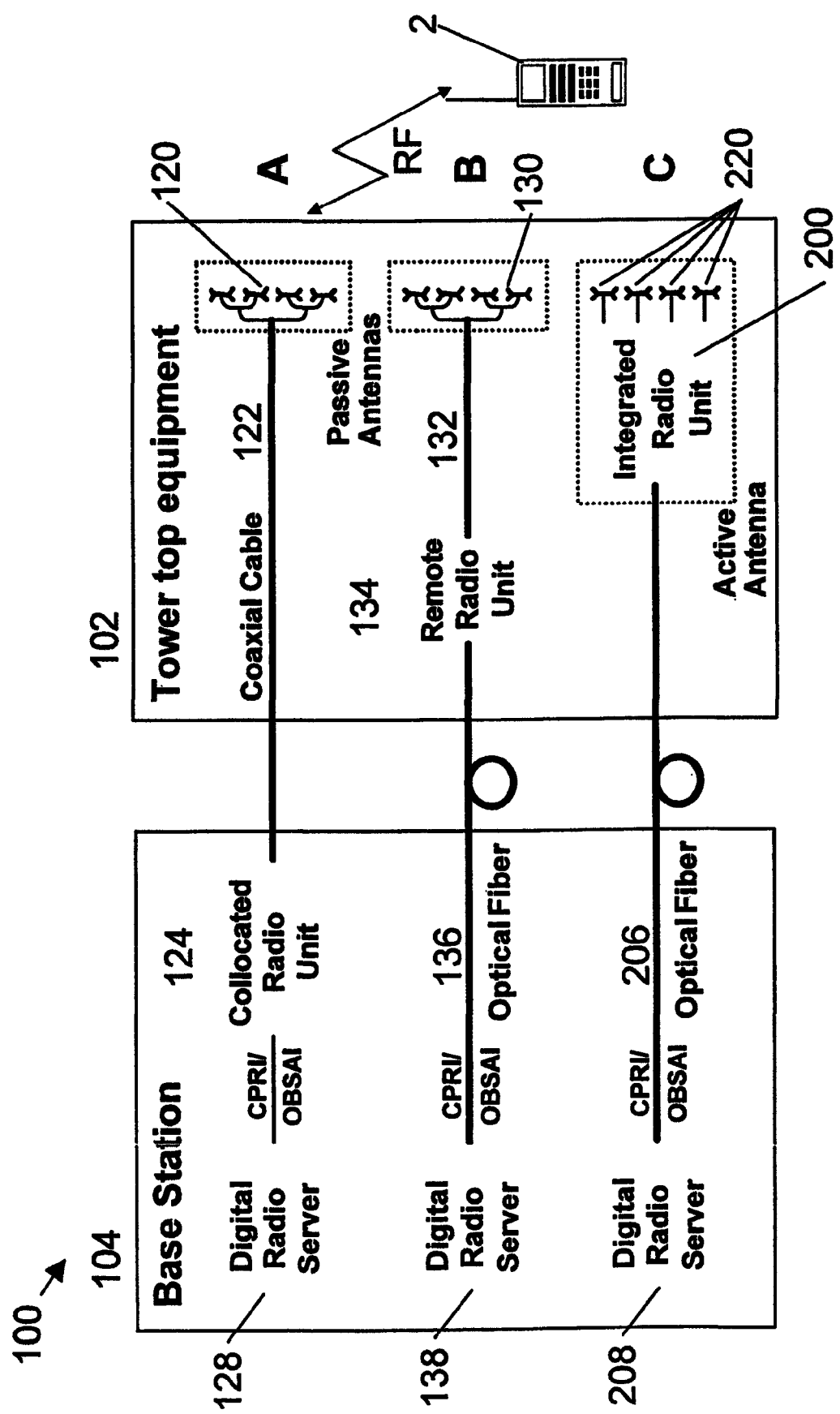
FIG. 2 shows base station configurations according to prior art and according to the teachings disclosed herein.

FIG. 2 shows three different configurations of base transceiver stations (BTS) 100. All BTS 100 comprise tower-top equipment 102 that is usually mounted—as discussed in the introduction—in an elevated position, such as on roof tops or towers, in order to maximize the coverage area of the BTS 100. The tower-top equipment 102 is connected to a base station 104 that may be in a specific housing beside or at some distance from the tower-top equipment.

In a first configuration (A) known in the art, a set of antennas or antenna elements 120 for receiving and sending radio signals from and to the mobile station 2 is linked with a coaxial cable 122 to a collocated radio unit 124. An analogue RF is received at the set of antennas or antenna elements 120 and passed to the collocated radio unit 124. In the collocated radio unit 124, the analogue radio RF signal is amplified, separated from a carrier frequency and converted into a digital signal. The digital signal is than further transferred to a digital radio server 128 from which the digital signal is passed on to the BSC 12 shown in FIG. 1 or vice versa. The length of the coaxial cable affects the signal-to-noise ratios and the efficiency of the BTS 100 as well as for the electrical power consumed and the configuration of electronics components necessary.

As discussed above, the tower-top equipment is in many cases located at exposed places such as tower tops, roofs or on the top of masts in order to maximize the area covered by the antennas. The length of the coaxial cable 122 may therefore become inefficiently long.

In a second configuration (B), a remote radio unit 134 is mounted at the tower top equipment 102. In that way a shorter coaxial cable 132 can be used to connect antennas or antenna elements 130 to the remote radio unit 134. The remote radio unit 134 converts modulated RF signals to communications signals in digital data format according to the CPRI or OBSAI standard. The communications signals are then transferred via optical fibres 136 to a digital radio server 138 that may be essentially identical or similar to digital radio server 128.

In configuration (A) and (B), the plurality of antenna elements form an antenna 120; 130 that is connected via one coaxial cable 122; 132 to the single radio unit 124; 134. The radio unit 124, 134 must then separate signals received from the plurality of antenna elements in order to separate different communications links handled in parallel.

In a third configuration (C) according to the teachings disclosed herein, a digital radio unit 200 is directly connected to the plurality of antenna elements 220 forming the antenna. Each one of the antenna elements 220 is thereby directly connected to the digital radio unit or its components. In this embodiment no coaxial cable is required in order to couple the digital radio unit 200 to the antenna elements 220. The digital radio unit 200 converts RF signals received and transmitted via the antenna elements 220 from/to the mobile station 2 into signals according to CPRI or OBSAI standard/ interface. These signals are then transferred via optical fibres to a digital radio server 208 located at base station 104. The optical fibre may thereby be up to 40 km long enabling the remote location of the base station 104 with respect to the tower-top equipment.

It is an attribute of the teachings disclosed herein that only the antenna elements 220 together with the digital radio unit 200 have to be installed at the location of the antenna. The base station 104 may be at some distance away. It is also possible, especially in urban areas with high antenna density, to connect several tower top equipments to a single one of the base stations 104.

The digital radio servers 128; 138; 208 may thereby be of the same type in all configurations (A) (B) and (C).

Figure 3C:
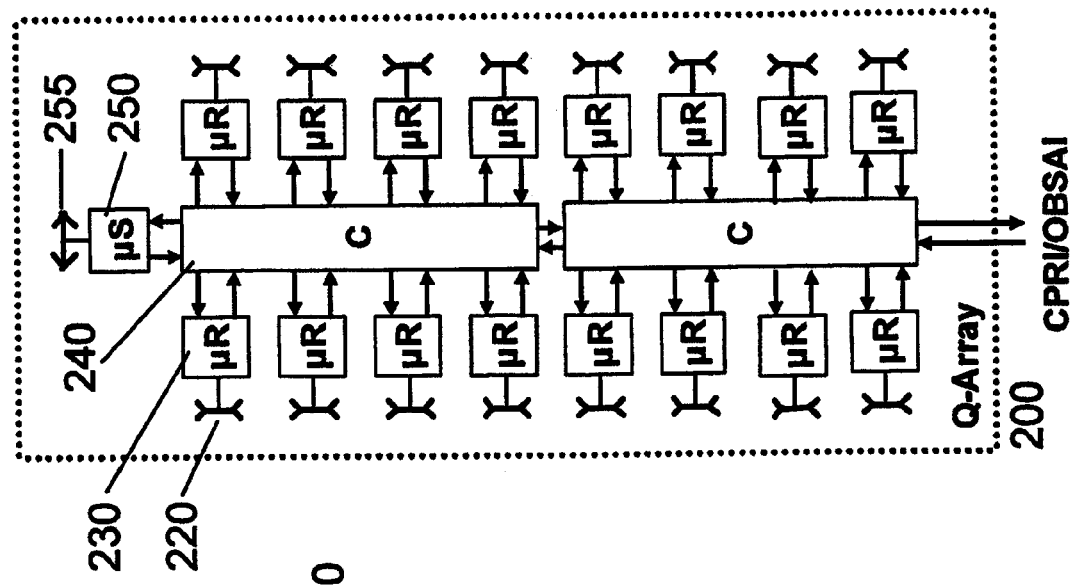
FIG. 3a to 3c shows different configurations of the all-digital antenna system according to the teachings disclosed herein.
Figure 3B:
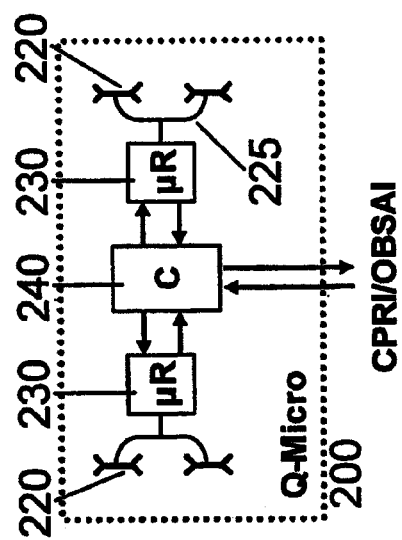
Figure 3A:
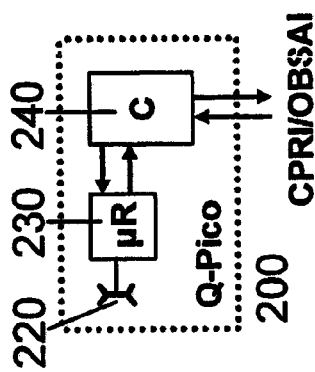

FIG. 3a to 3c show different embodiments of the digital radio units 200 according to the teachings disclosed herein. The digital radio unit 200 comprises at least one antenna element 220, at least one micro radio 230, and at least one C-hub 240.

In the embodiment shown in FIG. 3a, the digital radio unit 200 comprises a single antenna element 220 directly connected to one micro radio 230 and one C-hub 240. The micro radio 230 communicates with the C-hub 240 in a receiving and sending direction. The bi-directional serial interface between micro radio and C-hub is based on the well known standard termed 'SerDes'. The C-hub 230 is further connected to the digital radio server 208, i.e. via an optical fibre as shown in FIG. 2.

A plurality of the embodiments of FIG. 3a may be arranged and coupled in an array.

In the embodiment shown in FIG. 3b, a C-hub 240 is connected to two micro radios 230. Each of the micro radios 230 communicates in sending and receiving direction with the C-hub 240. Further, each micro radio 230 is connected to two antenna elements 220 via a so called Wilkinson splitter 225 known in the art.

FIG. 3c shows another embodiment of the teachings disclosed herein. In this embodiment a plurality of micro radios 230 are connected to one C-hub 240 whereby each of the micro radios 230 communicate in sending and receiving direction with the C-hub 240. Sixteen micro radios 230 are shown in FIG. 3c but this is not limiting the teachings disclosed herein. In this example, each one of the micro radios 230 is connected to a antenna element 220. Several C-hubs 240 each with 8 micro radios 230 and 8 antenna elements 240 may be linked together to form arrays of 16 or more antenna elements 220.

It will be obvious to a person skilled in the art that the embodiments shown are examples only and that any number of micro radios 230 may be connected to a C-hub 240. It is also obvious to a person skilled in the art that the number of antenna elements 220 per micro radio 230 can vary according to the needs of a particular application, although it is preferred to have one or two antenna elements 220 per micro radio 230. In addition, a plurality of C-hubs 240 can be coupled together (as is shown in FIG. 3c which includes two C-hubs 240).

In addition, a so called 'micro-sniffer' (μS) 250 can be connected to one of the C-Hubs 240 for monitoring and calibrating purposes. The micro-sniffer 250 is a special micro radio having inverse receive and transmit frequency band. The micro-sniffer 250 can be connected to the C-Hub 240 via the same or a similar interface. The micro-sniffer 250 additionally has an antenna 255 that may have the form of an antenna element or another form. The micro-sniffer 250 transmits pilot signals towards and detects the radiation emitted from the antenna elements 220, thus providing the C-Hubs 240 with feedback control information as required by the micro radios 230 for calibration purposes.

Figure 4A:
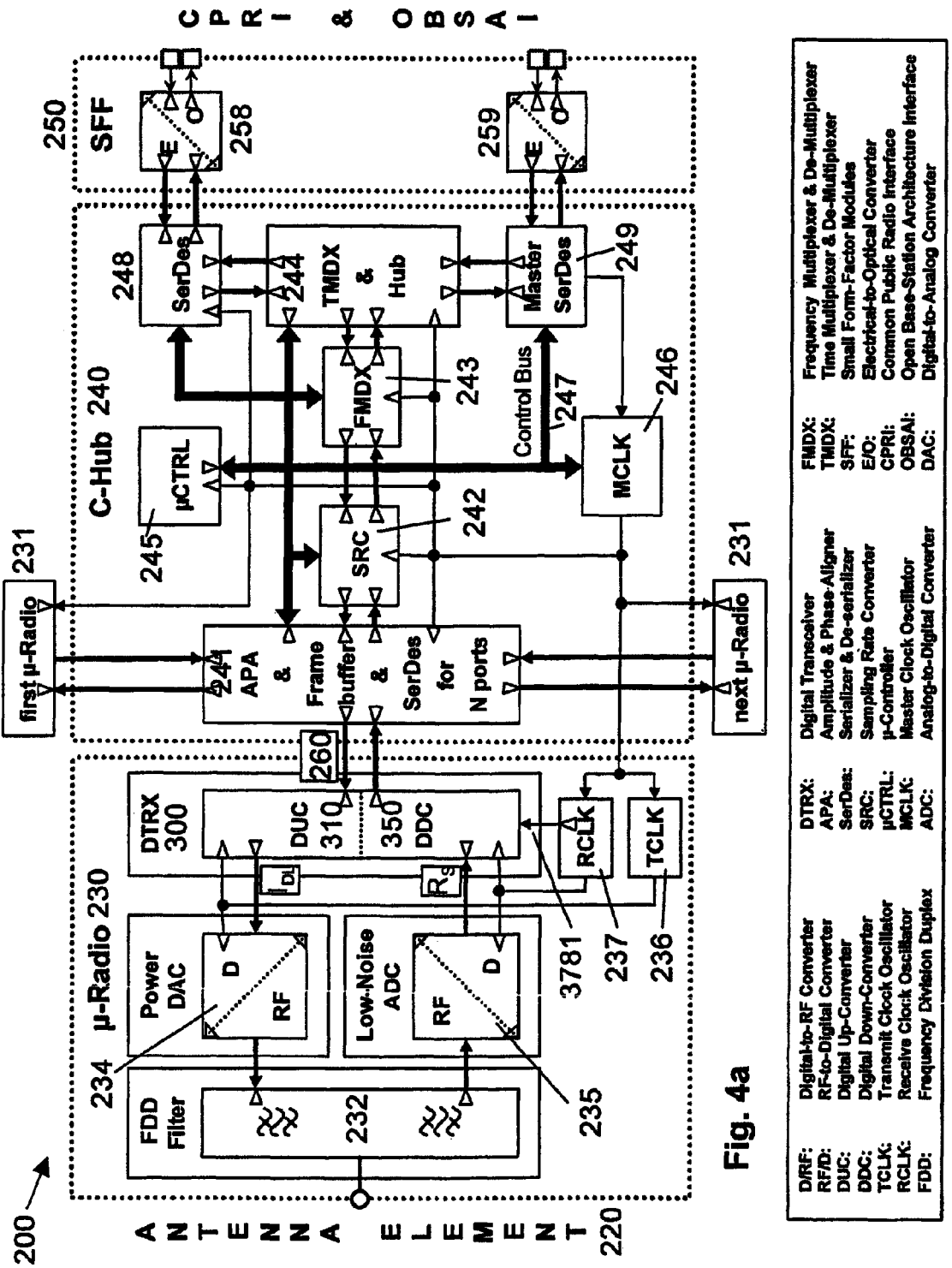
FIG. 4a shows in detail the components of a digital radio unit for FDD radio links according to the teachings disclosed herein.

FIG. 4a shows in greater detail a micro radio 230 and a C-hub 240 connected via a digital bi-directionally serial link (260) forming together a digital radio unit 200 according to the teachings disclosed herein. The antenna element 220 is directly connected to the micro radio 230. The antenna element 220 may, for example, be mounted on an antenna board or another circuit board onto which the micro radio 230 is arranged or attached. In an alternative embodiment, the micro radio 230 may be realized directly on the printed board.

The micro radio 230 shown in FIG. 4a is operated in FDD mode, thus comprising a FDD filter unit 232 at its antenna element entry which separates the RF signals in uplink and downlink direction by utilizing a combination of two band-pass filters embedded in the filter unit 232.

In uplink direction, a RF (radio frequency) signal received via the antenna element 220 and filtered by the FDD filter unit 232 is converted into a digital band-pass signal $R_S$ by the low-noise analogue-to-digital converter (ADC) 235. The ADC 235 and the digital down converter DDC 350 are clocked by a receive clock oscillator (RCLK) 237. The digital band-pass signal $R_S$ is down converted into a digital base-band signal by the digital down converter (DDC) 350 integrated in a digital transceiver (DTRX) 300. The DTRX 300 is arranged at the digital port of the micro-radio 230 from where the digital base-band signal is transferred to the C-hub 240.

The ADC 235 comprises a low-noise amplifier followed by a continuous-time sigma-delta band-pass modulator, both known in the art. The continuous-time sigma-delta band-pass modulator converts the incoming RF signal into the digital band-pass signal $R_S$ by utilizing a 2 or 3 level quantizer at a sample rate being 4 or 4/3 times the RF carrier frequency. Thus, the digital band-pass signal $R_S$ comprises the representative levels +1, −1 or +1, 0, −1 coded by one or two bits, respectively. This digital signal format is further on termed as 'single/1.5 bit' or 'bi-serial' in contrast to a 'multi-bit' format comprising more than 3 representative levels.

In downlink direction, a digital base-band signal received from the C-hub 240 is input into the DTRX 300 of the micro-radio 230 where it is up-converted into a digital band-pass signal $I_{DL}$ by a digital up-converter (DUC) 310. The digital band-pass signal $I_{DL}$ is then transferred to a power digital-to-analog converter (PDAC) 234 where it is converted into a RF signal. The PDAC 234 and DUC 310 are clocked by the transmit clock oscillator (TCLK) 236 at a sample rate being 4 or 4/3 times the RF carrier frequency. The RF signal is then passed through the FDD filter unit 232 and radiated via the antenna element 220. A separate power amplifier normally used in RF transmitters is not necessary because the power digital-to-analog converter (PDAC) 234 provides a sufficiently powered RF signal to be radiated via the antenna element 220.

Figure 4B:
Figure 4C:
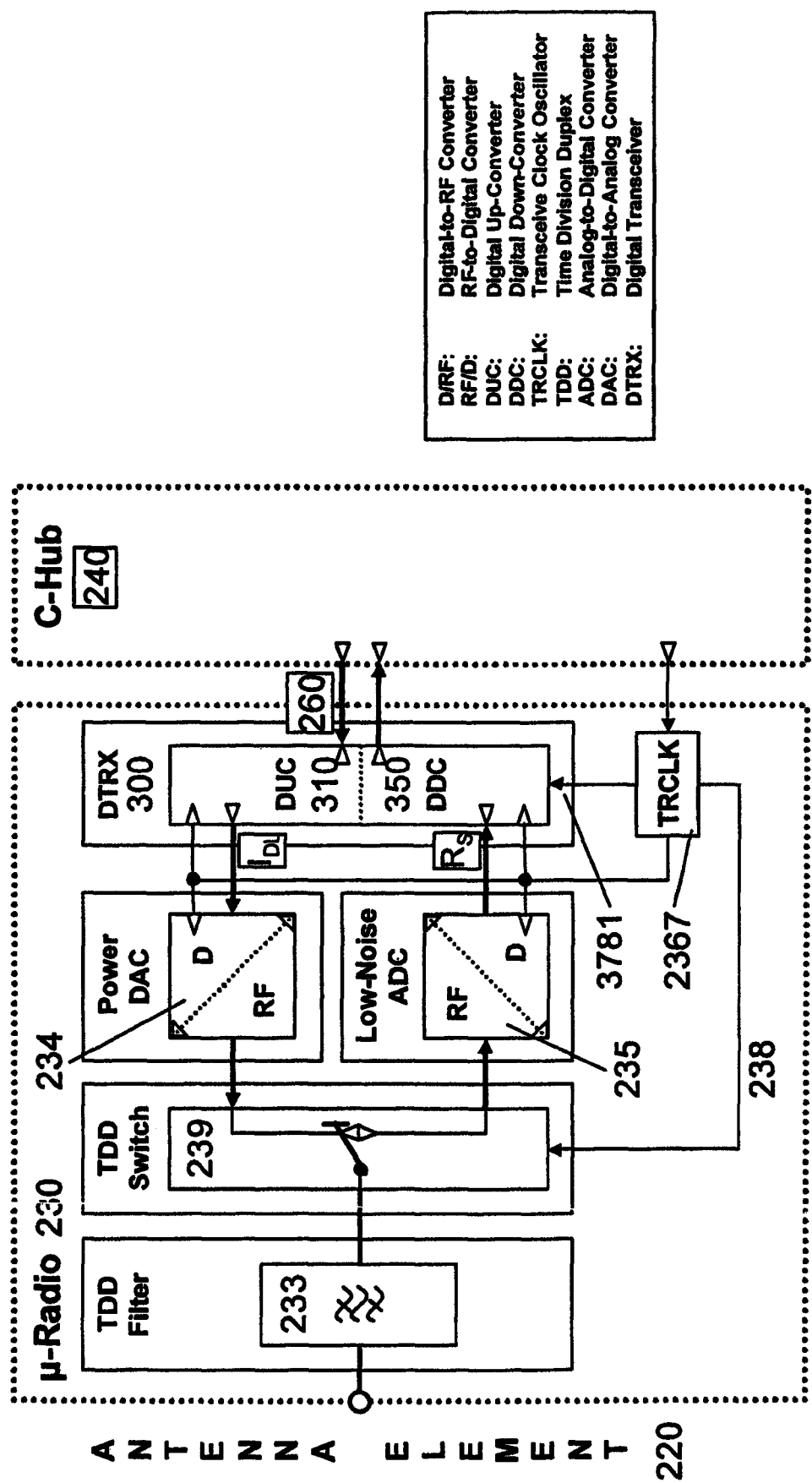
FIG. 4c shows in detail the components of a micro radio for TDD radio links according to the teachings disclosed herein.

The micro radio 230 shown in FIG. 4c is operated in TDD mode, thus comprising a TDD filter unit 233 at its antenna element entry followed by a TDD switch 239 which separates the RF signals in uplink and downlink direction within the time domain. The TDD switch 239 is controlled by a periodic signal 238 which is generated within the transceive clock oscillator (TRCLK) unit 2367 utilizing a synchronous counter which derives the periodic signal 238 from the transmit clock signal, a method well known in the art. The TRCLK unit 2367 further provides a common sampling clock for the transmit path as well as the receive path of the micro radio 230 plus a sub-sampling pulse (3781) for the DDC (350) utilizing another synchronous counter. The common sampling clock is sufficient because in TDD mode the same carrier frequency is used uplink and downlink, thus the sampling clock frequency being 4 or 4/3 times the carrier frequency (as discussed above) is also the same used uplink and downlink. All other elements and functions of the micro radio 230 operated in TDD mode are the same as shown in FIG. 4a for the micro radio 230 operated in FDD mode.

The digital up-converter (DUC) 310 contains one time-discrete sigma-delta band-pass modulator or alternatively two time-discrete sigma-delta low-pass modulators. In both cases, the modulators perform coarse quantization by use of 2 or 3 levels only providing a single/1.5 bit signal at the output. Thus, the digital band-pass signal $I_{DL}$ being generated by the digital up-converter (DUC) 310 only comprises the representative levels +1, −1 or +1, 0, −1 coded by one or two bits, respectively. Therefore, the power digital-to-analog converter (PDAC) 234 utilizes only 2 or 3 voltage levels, respectively, to represent the digital band-pass signal $I_{DL}$ in the analog domain.

The transmit clock oscillator (TCLK) unit 236 and the receive clock oscillator (RCLK) unit 237 are each comprising mainly a voltage controlled oscillator (VCO) embedded in a phase-locked loop (PLL) used for synchronization purposes. Clock oscillators utilizing a VCO plus PLL are known in the art and standard components or architectures may be applied.

It should be noted here, that those embodiments of the teachings disclosed herein where the samples of signals $I_{DL}$ and $R_S$ are represented in the 2-level format can be interpreted as a special case of the embodiments of the teachings disclosed herein utilizing the 3-level format to represent the samples of signals $I_{DL}$ and $R_S$. In both cases, two's complement arithmetic is applied. In case of the major embodiments, the representative levels +1, 0, −1 are coded by two bits where the upper bit denotes the sign-bit whilst the lower bit denotes the zero-bit being cleared (low state) when a zero-sample occurs. Thus, the major embodiments of the teachings disclosed herein can be operated also in a special mode using the 2-level format by keeping the zero-bit always at high state (non-zero).

The micro-radio 230 is connected to the C-hub 240. A bi-directional serial link (260) between the micro-radio 230 and the C-hub 240 is based on the well known standard termed 'SerDes'.

As known in the art, SerDes utilizes a self-clocking and DC-free channel code termed '8B/10B' representing each data byte by a code word comprising 10 bits whilst dedicated sequences of 10 bits are provided for synchronization. The SerDes functionality basically comprises parallel-to-serial as well as serial-to-parallel conversion, channel coding and decoding plus clock recovery and synchronization.

In low-cost CMOS technologies, SerDes supports symbol rates up to 2.5 Giga Baud representing a gross data rate of 2.0 Giga bits per second equivalent to 250 Mega bytes per second due to code rate 0.8 of the 8B/10B channel code.

An example of the data format used on the bi-directional serial link (260) between the micro radio 230 and the C-Hub 240 is shown in FIG. 4b and described in detail below.

The C-hub 240 comprises an amplitude and phase aligner (APA) 241 including a frame buffer and a serializer/de-serializer. APA 241 has N-ports for connecting N micro-radios. A plurality of micro-radios 230, 231 may be connected to one of the C-Hubs 240 as described with respect to FIG. 3c. In total N of the micro radios 230, 231 may be each connected to a port of the N-port phase aligner 241 and the signals received and transmitted from each one of the micro radios 230, 231 are treated in parallel and/or series by the subsequent components of C-Hub 240. The additional first and next micro-radios 231, may be identical to micro-radio 230, shown in greater detail in FIG. 4a.

The C-hub 240 comprises as further components a sample rate converter (SRC) 242 for adjusting the sampling frequency of the complex base-band signal to the RF carrier frequency, a frequency multiplexer/de-multiplexer (FMDX) 243, a unit 244 comprising time multiplexer/de-multiplexers (TMDX) around a hub and finally a master serializer/de-serializer (SerDes) 249 plus one or more serializers/de-serializers (SerDes) 248.

The TMDX and hub unit 244 performs packet data handling and distribution of data streams in CPRI and/or OBSAI format controlled by adjacent signalling information. Thus, only those data packets which are dedicated to be received and transmitted by the connected micro-radios 230, 231 are handed over from/to the FMDX unit 243 for further processing. Other data packets are passed through via the CPRI and/or OBSAI links supporting the so called cascading. The data packets contain I and Q samples of base-band signals in a given packet format which is identified by the adjacent signalling information. The packet format defines the number and word length of the samples, the bandwidth of the base-band signal being represented by said samples and the frequency of its sub-carrier.

The frequency multiplexer/de-multiplexer (FMDX) unit 243 comprises several digital modulators and de-modulators for simultaneously up and down converting a variety of base-band signals to/from its respective sub-carrier frequencies. The modulated signals can be easily combined in the frequency domain by use of a simple adder stage, thus enabling multi-carrier operation.

All components of the C-hub 240 are controlled by a micro-controller (μCTRL) 245 to whom they are connected via a control bus 247 and clocked by a master clock oscillator (MCLK) unit 246 comprising a voltage controlled oscillator (VCO) embedded in a phase-locked loop (PLL) used for synchronization purposes. The master clock oscillator 246 must be synchronized to the clock frequency of the CPRI and/or OBSAI transport signal (both of which formats utilize the self-clocking SerDes protocol) derived by the clock recovery unit within the master serializer/de-serializer (SerDes) 249. The master clock oscillator (MCLK) 246 also synchronizes the transmit clock oscillator 236 and the receive clock oscillator 237 of the micro radios 230/231.

All components of the C-hub 240 can be commercially available components known to a person skilled in the art.

A small form-factor module (SFF) 250 comprising one or more electro-optical converters (E/O) 258 and 259 is connected to the SerDes 248 and 249, respectively. Electro-optical converters are known in the art and are applied to convert the digital electrical signal into an optical signal that can be transferred with known standards such as CPRI (common public radio IF) or OBSAI, i.e. via optical fibres to a digital radio server as shown in FIG. 2.

FIG. 4b shows the data format of the bi-directional serial interface between the micro-radio 230 and the C-Hub 240. A data frame format comprising FL bytes is used in either direction. As depicted in FIG. 4b, the header contains a frame synchronization byte and a control byte followed by K data bytes and some non-dedicated residual bytes free for arbitrary use. Thus, the frame is only partially pay-loaded. This partially pay-loaded frame format combined with frame data buffering enables the tuning of the carrier frequencies used in both transmit and receive paths of the micro-radio 230 whereas the over-sampling ratios $N_T$ and $N_R$ within the DTRX 300 remain constant as well as the clock rate of the bi-directional serial interface being always 2.5 GHz.

Assuming a preferred format of 16 bits or 2 bytes per sample for each in-phase and quadrature component of the complex base-band signal, the sample rate (SR) being transmitted over each serial 2.5 GHz link is given in MHz by $SR=125 \cdot K/FL$.

In practice, FL comprises several hundred bytes whereas SR is in the range of 120 MHz.

Thus, the carrier frequencies used in the micro radio 230 in 4:1 mode can be tuned by a step size $\Delta f_{CT}=1/4N_T \cdot SR_T/FL_T$ in the transmit path and by a step size $\Delta f_{CR}=1/4N_R \cdot SR_R/FL_R$ in the receive path.

Figure 5:
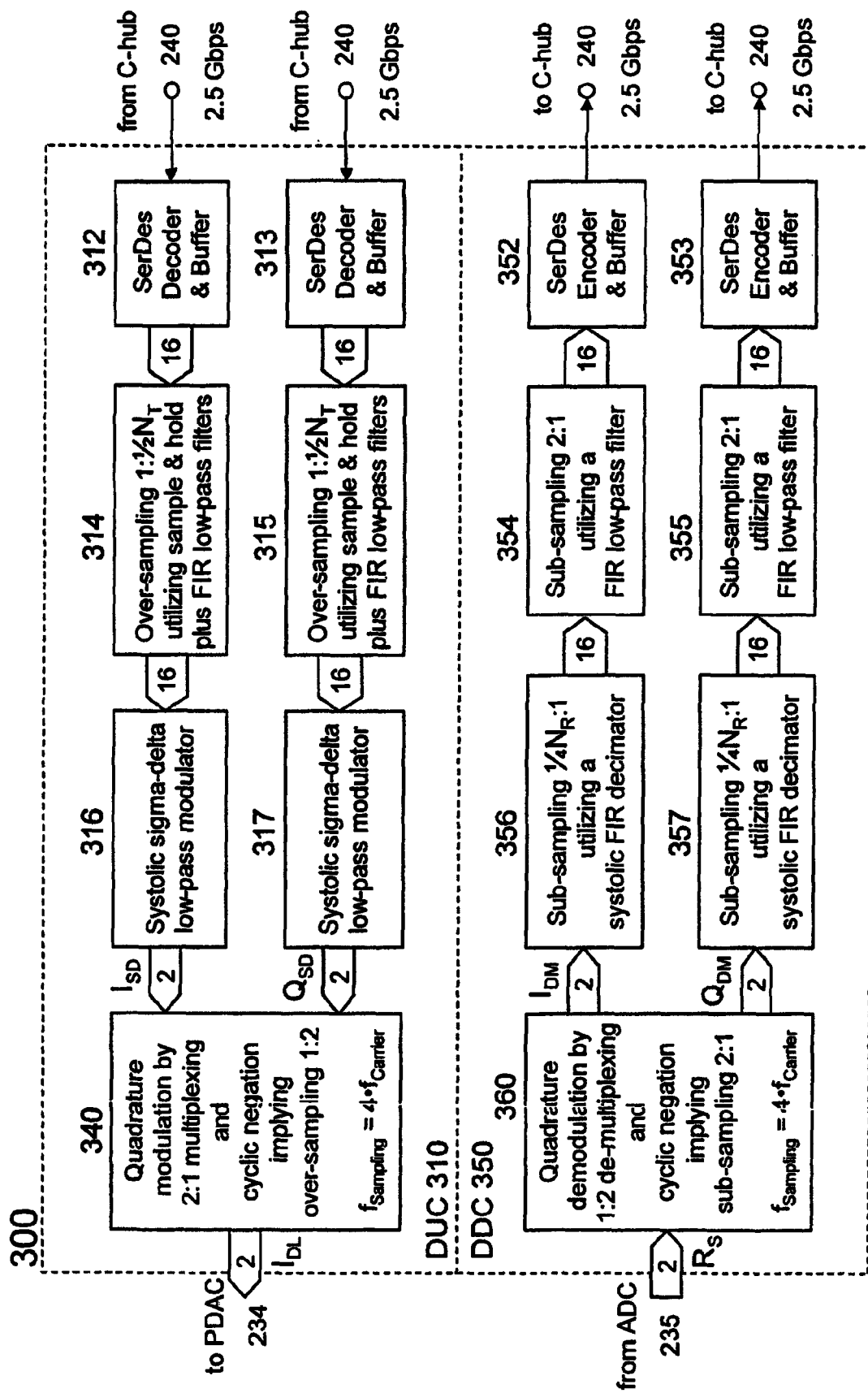
FIG. 5 depicts a functional block diagram of a digital transceiver (DTRX) according to the teachings disclosed herein in 4:1 mode.

When the micro radio 230 is used in 4:1 mode utilizing a DTRX 300 as described in detail with respect to FIG. 5, the micro radio 230 supports complex base-band signals having a bandwidth of 60 MHz at carrier frequencies around 2 GHz. According to Shannon's sampling theorem, each component of this complex base-band signal requires a sampling rate being at least 60 MHz.

Thus, a fine-tuneable over-sampling ratio of approximately 2 is applied by a sample rate converter (SRC) 242 within the C-Hub 240 adapting the base-band sampling rate to those sampling rates $SR_T$ and $SR_R$ utilized on the bi-directional serial interface.

FIG. 5 shows a functional block diagram of a DTRX 300 in a 4:1 operating mode. The DTRX 300 may work over a 60 MHz bandwidth at carrier frequencies around 2 GHz. The DTRX 300 is divided into two parts, the DUC 310 and the DDC 350, that respectively provide base-band to carrier frequency up-conversion and carrier frequency to base-band down-conversion.

In the 4:1 mode and in the transmitting direction, a data signal from C-Hub 240 according to the data format shown in FIG. 4b being based on the SerDes standard is applied to the DUC 310 as an I-signal (in-phase signal) and a Q-signal (quadrature signal). The data signal may be input at rates of 2.5 Gbps. Both signals are first decoded and buffered at a SerDes Decoder and Buffer 312 and 313 for the I-signal $I_0$ and the Q-signal $Q_0$, respectively. The data signals are then further transferred as 16 bit word length signals to units 314 and 315, respectively, comprising sample-and-hold stages plus FIR low-pass filters where the I-signal and the Q-signal are over-sampled by $1:1/2 \cdot N_T$. The SerDes Decoders and Buffers 312 and 313 and the over-sampling by sample-and-hold plus FIR low-pass filter units 314 and 315 are known in the art and standard components or architectures may be applied.

Both the I-signal and the Q-signal are then further transferred to systolic sigma-delta low-pass modulators 316 and 317, respectively, which are described in our co-pending US provisional patent and UK Patent Application No. GB 0611096.9, both filed on 2 Jun. 2006. The teachings of this patent application are incorporated herein by reference.

The sigma-delta low pass modulator 316 outputs a 3 level signal $I_{SD}$ and the sigma-delta low pass modulator 317 outputs a 3 level signal $Q_{SD}$. Both 3 level signals comprising the values +1, 0, −1 are each represented by 2 bits, thus being further addressed as '2-bit signals'.

Both 2-bit signals $I_{SD}$ and $Q_{SD}$ are applied to a quadrature modulation by multiplexing and cyclic negation block 340 in which the signal $I_{SD}$ and the signal $Q_{SD}$ are over-sampled by 1:2, cyclically negated and 2:1 multiplexed to a single 2-bit output signal $I_{DL}$ applied to the PDAC 234 shown in FIG. 4*a*. The function of the quadrature modulation by multiplexing and cyclic negation block 340 will be described in detail with respect to FIGS. 7*a*, 7*b* and 8*a*-*i*.

In receiving direction a 2-bit signal $R_S$ also representing 3 levels (+1, 0, −1) is received at the DTRX 300 from the ADC 235 shown in FIG. 4*a* and applied to a quadrature de-modulation by de-multiplexing and cyclic negation block 360 of DDC 350 in DTRX 300. The 2-bit signal $R_S$ is 1:2 de-multiplexed, cyclically negated and 2:1 sub-sampled to a 2-bit I-signal $I_{DM}$ and a 2-bit Q-signal $Q_{DM}$. The function of the quadrature de-modulation by de-multiplexing and cyclic negation block 360 will be explained in detail with respect to FIGS. 10 and 11.

The signals $I_{DM}$ and $Q_{DM}$ are further passed on to systolic FIR decimator blocks 356 and 357, respectively, where the signals are decimated by FIR filtering and $1/4 \cdot N_R:1$ sub-sampling and output as a 16-bit I-signal and a 16-bit Q-signal. The systolic FIR decimator blocks 356 and 357 will be described in detail with respect to FIGS. 12, 13 and 14.

From the systolic FIR decimator blocks 356 and 357 the I-signal and the Q-signal are further transferred as 16-bit signals to FIR low-pass and sub-sampling blocks 354 and 355, respectively, where the I-signal and the Q-signal are 2:1 sub-sampled. Both the I-signal and the Q-signal are then passed on to a SerDes encoder and buffer 352 and 353, respectively, from where the I-signal and the Q-signal are output from the DDC 350 and sent to C-hub 240 as shown in FIG. 4*a*. The FIR low-pass and sub-sampling blocks 354 and 355 and the SerDes encoders and buffers 352 and 353 are known in the art and standard components or architecture may be applied.

Figure 6A:
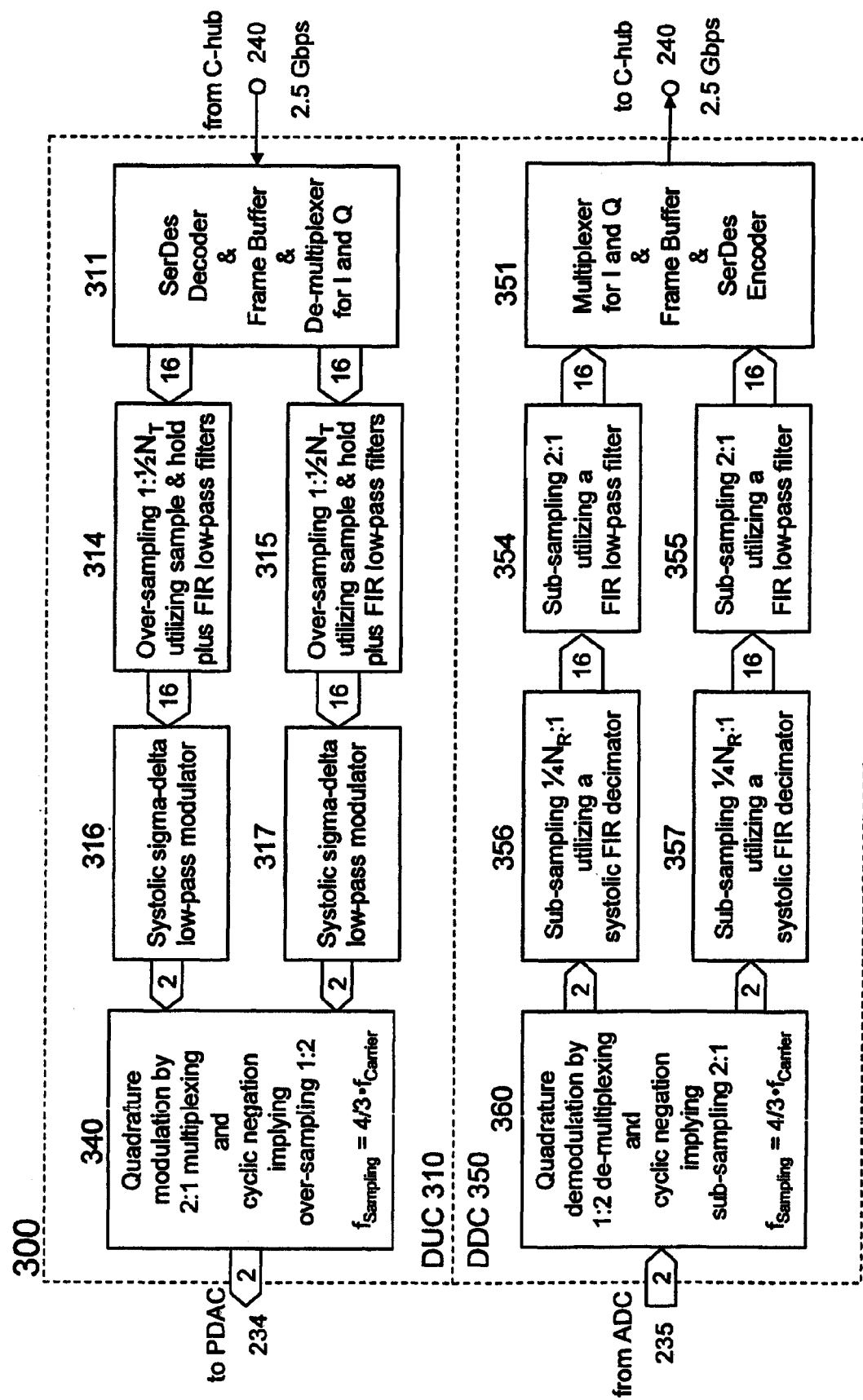
FIGS. 6a and 6b show functional block diagrams of two embodiments of a digital transceiver (DTRX) in 4:3 mode.
Figure 6B:
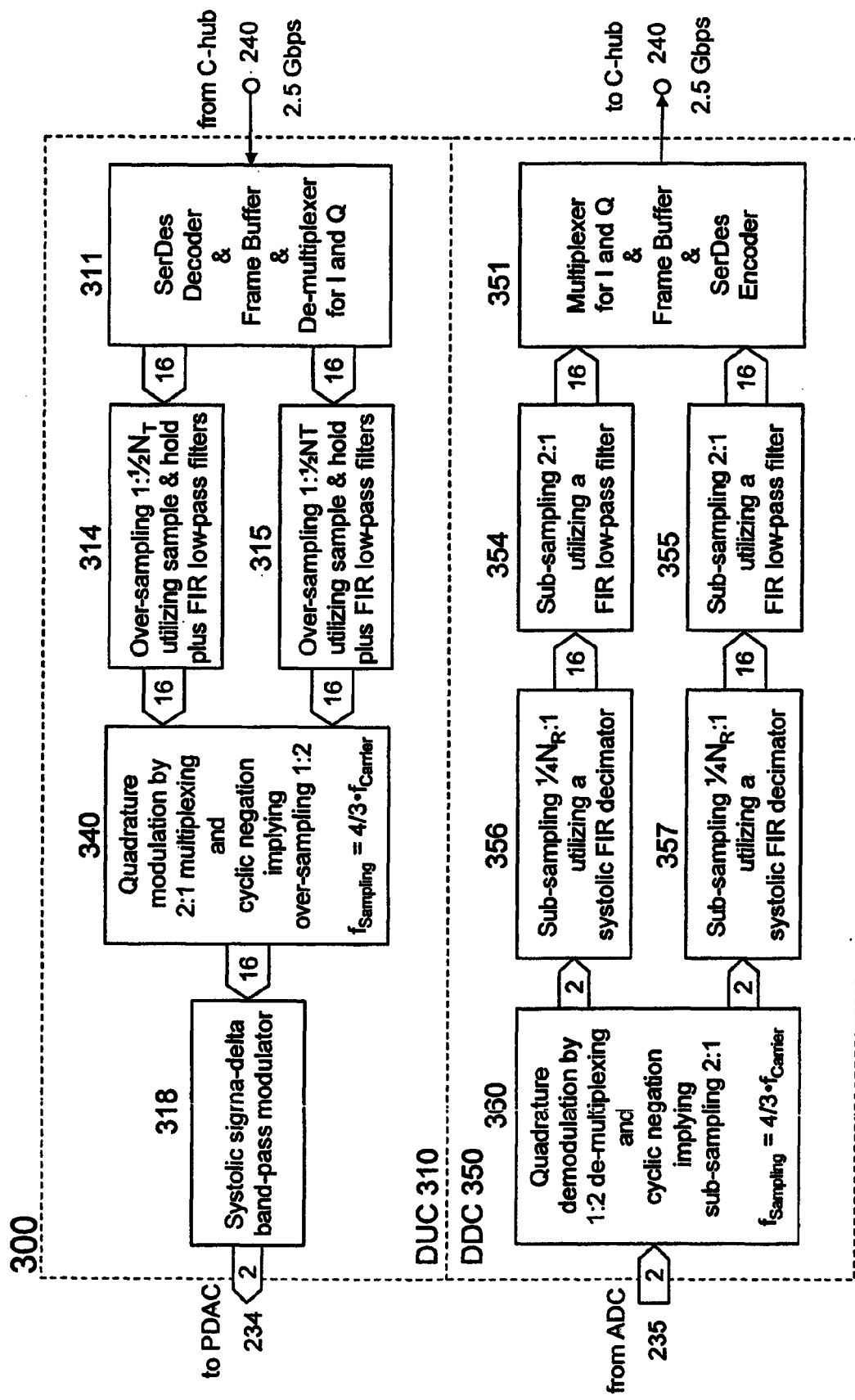

FIGS. 6*a* and 6*b* show a functional block diagram of two different alternative embodiments of DTRX 300 in 4:3 operating mode (4:3 mode). In 4:3 mode, the DTRX 300 may work at a 20 MHz bandwidth at carrier frequencies around 2 GHz.

In 4:3 mode the DTRX 300 and its component may be the same or similar to the DTRX used in 4:1 mode as described with respect to FIG. 5. Thus, the DTRX in 4:3 mode is divided into two parts, the DUC 310 and the DDC 350, that provide base-band to carrier frequency up-conversion and carrier frequency to base-band down-conversion, respectively.

In contrast to the 4:1 mode, a data signal from C-Hub 240 in 4:3 mode is applied to the DUC 310 as a single bit stream only. The data signal may be input at rates of 2.5 Gbps. The incoming signal is first decoded, buffered, and de-multiplexed into an I-signal and a Q-signal by a SerDes decoder, frame buffer and de-multiplexer block 311. The de-multiplexed and separated I-signal and Q-signal are further transferred separately as 16-bit word length signals to over-sampling by sample-and-hold plus FIR low-pass filter units 314 and 315, respectively, as described above with respect to FIG. 5. All further signal treatment of this embodiment is identical to the 4:1 mode described above. I-signal and Q-signal are further passed from over-sampling by sample-and-hold plus FIR low-pass filter units 314 and 315 to systolic sigma-delta low-pass modulators 316 and 317, respectively.

Each of the sigma-delta low pass modulators 316 and 317 outputs a 3 level signal (+1, 0, −1) represented by 2 bits, thus being addressed as '2-bit signal'. Both 2-bit output signals of the sigma-delta low-pass modulators 316 and 317 are connected to the quadrature modulation by multiplexing and cyclic negation block 340, where the I-signal and Q-signal are over-sampled by 1:2, cyclically negated and 2:1 multiplexed into a single 2-bit output signal applied to the PDAC 234 shown in FIG. 4*a*. In 4:3 mode however, the sampling rate is $f_{Sampling} = 4/3 \cdot f_{Carrier}$.

In receiving direction of the embodiment shown in FIG. 6*a* and analogous to the embodiment of FIG. 5, a 2-bit signal is received from the ADC 235 shown in FIG. 4*a* and applied to a quadrature de-modulation by de-multiplexing and cyclic negation block 360 of DDC 350 in DTRX 300 working in 4:3 mode. The signal is 1:2 de-multiplexed, cyclically negated and 2:1 sub-sampled into an I-signal (in-phase signal) and a Q-signal (quadrature signal) at $f_{Sampling} = 4/3 \cdot f_{Carrier}$. The 2-bit I-signal and the 2-bit Q-signal are further passed on to systolic FIR decimators 356 and 357, respectively, and then transferred as 16-bit signals to FIR low-pass and sub-sampling blocks 354 and 355, respectively.

In contrast to the 4:1 mode embodiment shown in FIG. 5, in the 4:3 mode both 16-bit signals are then applied to one multiplexer, frame buffer, and SerDes encoder 351, from where the multiplexed signal is output from the DDC 350 and sent to C-hub 240 as shown in FIG. 4*a*.

FIG. 6*b* illustrated yet another example of a DTRX 300 in 4:3 mode. In this embodiment and in transmitting direction of the DUC 310, the quadrature modulation by multiplexing and cyclic negation block 340, which may be comparable to the quadrature modulation by multiplexing and cyclic negation block 340 of the embodiment of FIGS. 5 and 6*a*, is connected directly to both over-sampling by sample-and-hold plus FIR low-pass filter units 314 and 315. The I-signal and Q-signal provided at the outputs of units 314 and 315 are over-sampled by 1:2, cyclically negated and 2:1 multiplexed into a single 16-bit output signal that is applied to a single systolic sigma-delta band-pass modulator 318, which is described in our co-pending US provisional patent and UK Patent Application No. GB 0611096.9, both filed on 2 Jun. 2006. The 2-bit output signal of the single systolic sigma-delta band-pass modulator 318 is then applied to the PDAC 234.

The receiving DDC 350 may in this embodiment be identical to that described with respect to FIG. 6*a*.

FIG. 7*a* shows a unit 3400 comprising a generic digital quadrature modulator 3410 combined with a 1:2 over-sampling pre-stage 3200. The over-sampling pre-stage 3200 consists of two equally tapped FIR low-pass filters 3360 and 3370 as well as two interpolating blocks 3260 and 3270 which are fed by the input signals $I_{SD}$ and $Q_{SD}$. Over-sampling 1:2 prior to the quadrature modulator is needed because the signals $I_{SD}$ and $Q_{SD}$ are output by sigma-delta low-pass modulators generating significant out-of-band quantization noise. Without the over-sampling pre-stage 3200 the out-of-band quantization noise would be shifted by the quadrature modulation process into the pass-band of the band-pass signal $I_{DL}$ at the modulator output. FIG. 7b shows illustrative examples of corresponding signals.

In a first step below, the functionality of the unit 3400 will be explained in detail referring to FIGS. 7a and 7b. In a second step, it will be shown for a special case being relevant for the embodiments of what is disclosed herein that the functionality of the unit 3400 is equivalent to the functionality of the quadrature modulation by multiplexing and cyclic negation block 340 of the DUC 310 of the DTRX 300 of FIG. 5. However, the realization of the quadrature modulation by multiplexing and cyclic negation block 340 is much simpler compared to a realization of the unit 3400.

The 2-bit I-signal $I_{SD}$ from the systolic sigma-delta low-pass modulator 316 as depicted in FIG. 5 is assumed to be applied to an interpolating block 3260 of the over-sampling pre-stage 3200. In parallel, the 2-bit Q-signal $Q_{SD}$ from the systolic sigma-delta low-pass modulator 317 is assumed to be applied to an interpolating block 3270 of the over-sampling pre-stage 3200. Examples of sequences of input signals $I_{DS}$ and $Q_{DS}$ are shown in FIGS. 8a and 8b, respectively.

At the interpolating blocks 3260 and 3270, $I_{SD}$ and $Q_{SD}$ are 1:2 over-sampled respectively. First, the clock rate is doubled and zero samples are inserted in signals $I_{SD}$ and $Q_{SD}$ obtaining signals $I_{SD\uparrow 2z}$ and $Q_{SD\uparrow 2z}$. Examples for the signals $Q_{SD}$ and $Q_{SD\uparrow 2z}$ are shown in FIG. 7b. The signals $I_{SD\uparrow 2z}$ and $Q_{SD\uparrow 2z}$ are then applied to low-pass filters 3360 and 3370, respectively where the signals $I_{SD\uparrow 2z}$ and $Q_{SD\uparrow 2z}$ are each divided into two lines. One line is directly applied to adders 3340 and 3350, respectively, while the other line is passed through registers 3320 and 3330, respectively. In registers 3320 and 3330, the signal is delayed by one clock cycle and then applied to the adders 3340 and 3350, respectively, resulting in signals $I_{DS\uparrow 2}$ and $Q_{DS\uparrow 2}$ showing duplicated adjacent samples, examples of which are shown in FIGS. 7b, 8d and 8e.

It should be noted that the duplication of adjacent samples as a result of an interpolation by equally tapped FIR low-pass filtering can be performed also by use of a sample-and-hold stage. In case of higher over-sampling ratios, the use of a sample-and-hold stage is much more economic compared to equally tapped FIR low-pass filters. Therefore, sample-and-hold stages are utilized within the over-sampling blocks 314 and 315 as depicted in FIGS. 5, 6a and 6b.

The signals $I_{DS\uparrow 2}$ and $Q_{DS\uparrow 2}$ are further applied to the quadrature modulator 3410. In the generic digital quadrature modulator 3410 the over-sampled input signals $I_{SD\uparrow 2}$ and $Q_{SD\uparrow 2}$ are pair wise multiplied in multipliers 3460 and 3470 by the two components $I_0$ and $Q_0$, respectively, of a complex carrier signal (I denotes the respective in-phase component and Q denotes the respective quadrature component). Examples of signals $I_0$ and $Q_0$ are illustrated in FIGS. 8c and 8f, respectively. Feeding the resulting signal products $I_0 \cdot I_{DS\uparrow 2}$ as shown in FIG. 8g and $Q_0 \cdot Q_{DS\uparrow 2}$ as shown negated in FIG. 8i into a comparator stage 3480 yields at the output of the quadrature modulator 3410 the in-phase component $I_{DL}$ of the complex digital band-pass signal for the down-link channel. The resulting example signal $I_{DL}$ is shown in FIG. 8h.

Figure 8:
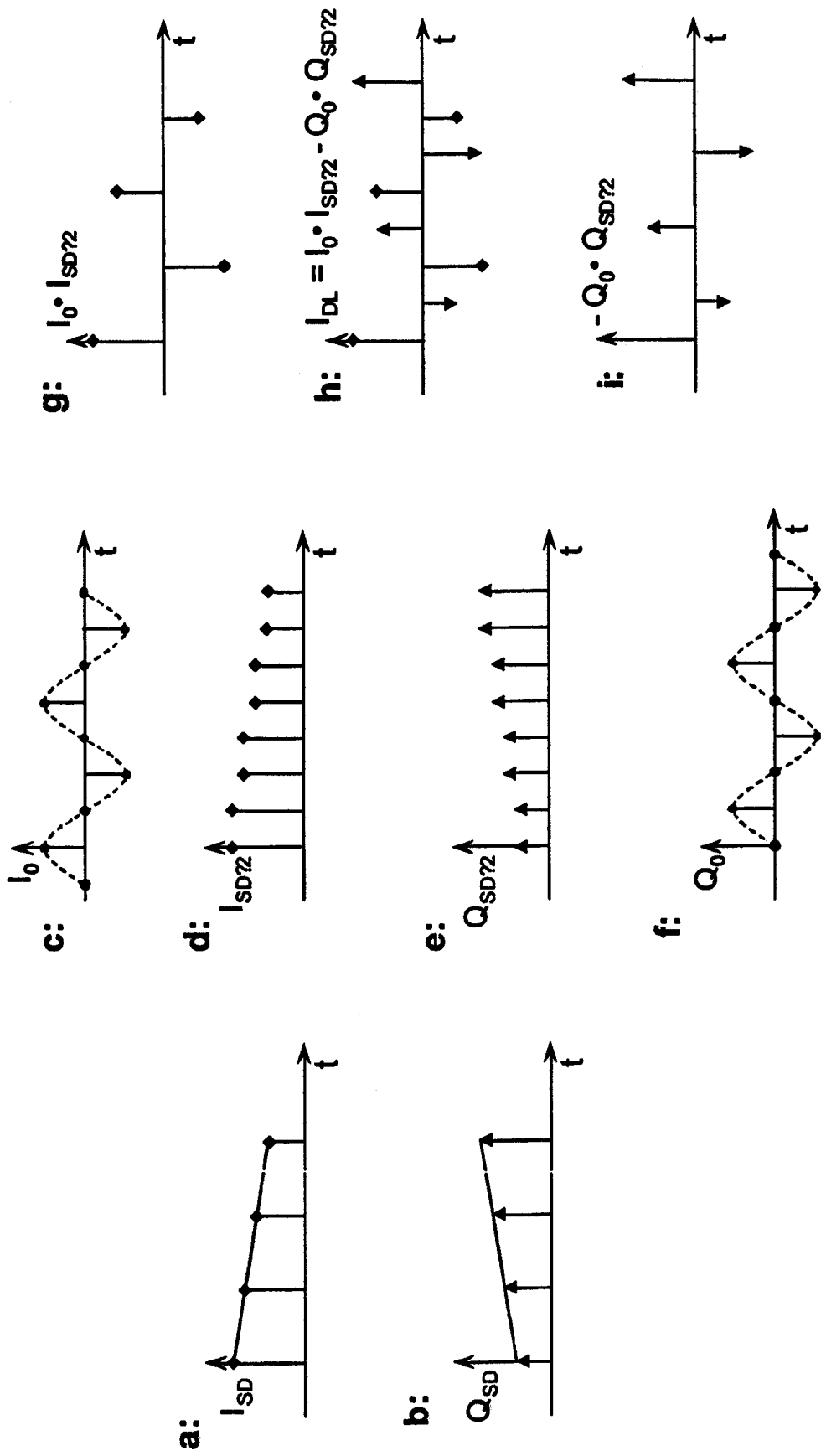

A preferred choice of the sampling frequency being four times the carrier frequency is demonstrated by the signal diagrams in FIG. 8. In this particular case, the quadrature modulator 3410 and the over-sampling pre-stage 3200 together are interlacing both input signals $I_{SD}$ and $Q_{SD}$ whilst the input signals $I_{SD}$ and $Q_{SD}$ signals are cyclically negated to generate the output signal $I_{DL}$ as illustrated in FIG. 8h.

Figure 9:
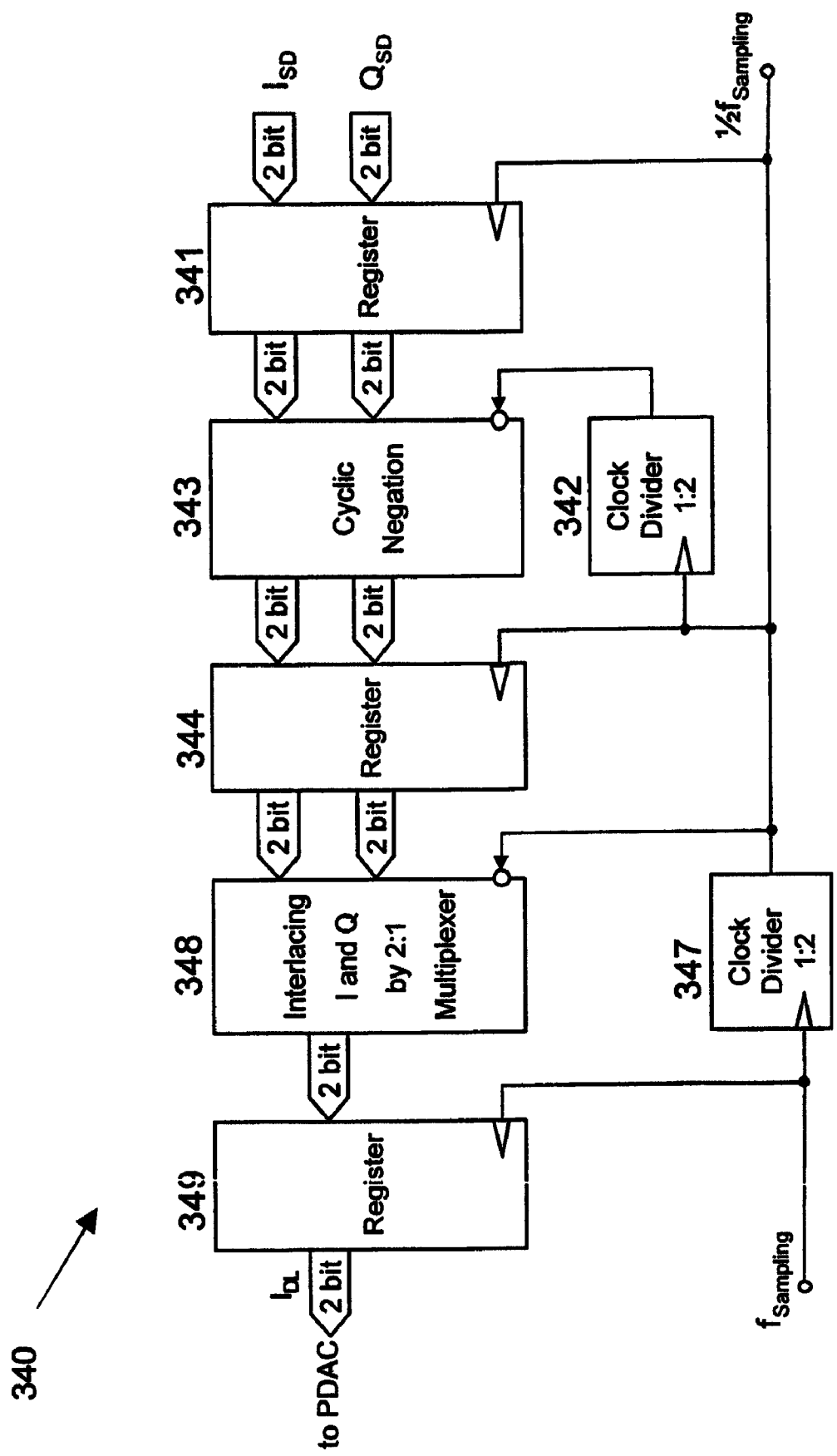
FIG. 9 shows a pipelined realization of the quadrature modulation by 2:1 multiplexing and cyclic negation block of the DUC of FIG. 5.

Therefore, the generic digital quadrature modulator 3410 together with the over-sampling pre-stage 3200 of FIG. 7a can be replaced by a much simpler circuitry 340 illustrated in FIG. 9 comprising only a multiplexer 348 to interlace the input signals $I_{SD}$ and $Q_{SD}$ and cyclically controlled inverters, provided that the 2-bit input signals $I_{SD}$ and $Q_{SD}$ are generated in two's complement notation. Thus, the cyclic negation can be performed by inverting the upper bit denoting the sign of the 3 level signal (+1, 0, −1) but only in the non-zero case whilst the lower bit denoting a zero remains unchanged in any case.

FIG. 9 shows the unit 340 performing quadrature modulation in 4:3 mode by 2:1 multiplexing and cyclic inversion. 2-bit input signals $I_{SD}$ and $Q_{SD}$ are first red into register 341, transferred to a cyclic negation block 343 clocked by clock the divider 342. In the cyclic negation block 343 the I- and Q-signals are cyclically negated by inverting the upper bit but only in the non-zero case. Subsequently, the cyclically negated I- and Q-signals are transferred into register 344 before they are interlaced by a 2:1 multiplexer 348. Interlacing I and Q by the 2:1 multiplexer 348 is triggered by second clock divider 347. Thus, at a duplicated clock cycle both I and Q signals are 1:2 over-sampled in course of being interlaced by multiplexing to one 2-bit signal that is transferred to register 349 from where it is output as $I_{DL}$ signal towards PDAC 234.

Quadrature modulation by 2:1 multiplexing and cyclic negation according to FIG. 9 can be realized as pipelined logic using exclusively low cost CMOS technology even in high speed applications being clocked at several GHz.

A generic digital quadrature de-modulator 3600 followed by two low-pass decimators 356 and 357 is depicted in FIG. 10. The incoming receiver signal $R_S$ is multiplied by two components $I_0$ and $Q_0$ of the conjugated complex carrier signal by multipliers 3660 and 3670, respectively, where $I_0$ denotes the in-phase component and $Q_0$ denotes the quadrature component. Each output signal $I_{DM}$ and $Q_{DM}$ of quadrature de-modulator 3600 passes a low-pass decimator 356 and 357 comprising a low-pass filter followed by a sub-sampler to achieve two components $I_{BB}$ and $Q_{BB}$ of the complex baseband signal at the outputs of the low-pass decimators 356 and 357.

A preferred choice of the sampling frequency being four times the carrier frequency is demonstrated by the signal diagrams shown in FIG. 11. In this particular case the samples of signal $R_S$ illustrated as example in FIG. 11b are alternately passed to the de-modulator outputs $I_{DM}$ and $Q_{DM}$ illustrated as examples in FIGS. 11d and e, respectively, whilst being cyclically negated by the process of de-modulation. Therefore, the two multipliers 3660 and 3670 can be economically replaced by a simple de-multiplexer and cyclically controlled inverters, provided that the 2-bit input signal $R_S$ is given in two's complement notation. Thus, the cyclic negation is performed by inverting the upper bit denoting the sign of the 3 level signal $R_S$ (+1, 0, −1) but only in the non-zero case whilst the lower bit denoting a zero remains unchanged in any case.

As a preferred embodiment of what is disclosed herein, the functionality of a generic digital quadrature de-modulator 3600 according to FIG. 10 is implemented as quadrature de-modulation by de-multiplexing and cyclic negation within block 360 followed by low-pass decimators 356 and 357 of the DDC 350 of DTRX 300 of FIG. 5. Block 360 can be realized as simple pipelined logic using exclusively low cost CMOS technology even in high speed applications being clocked at several GHz.

Furthermore, the low-pass decimators 356 and 357 can be operated at half the sampling frequency of the sampled receiver signal $R_S$ because every second sample of both decimator input signals $I_{DM}$ and $Q_{DM}$ has alternately a zero value.

Figure 12:
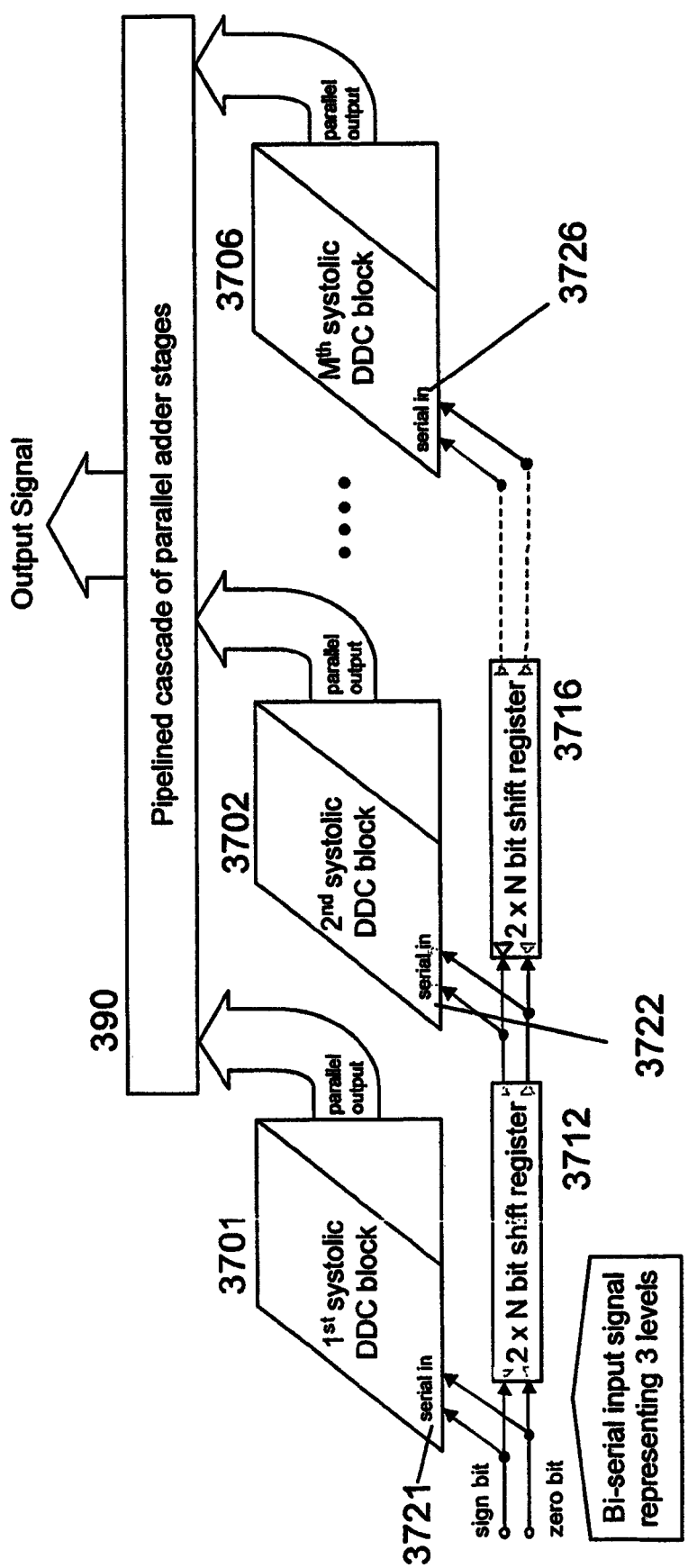
FIG. 12 shows the block diagram of a systolic N:1 decimator for digital down conversion.

FIG. 12 shows a block diagram of a systolic FIR decimator utilized for digital down conversion. The example shown is adapted for digital decimation of a 1.5 bit signal. The systolic FIR decimator comprises a FIR filter having N×M coefficients combined with N:1 sub-sampling and can be applied as sub-sampling unit 356 and 357, respectively, within the DDC 350 of FIG. 5.

A decimation process performing FIR filtering plus sub-sampling is realized using a number of M systolic DDC blocks 3701, 3702 up to 3706. A plurality of the M DDC blocks 3701, 3702 up to 3706 may be arranged and work in parallel. Each one of the M DDC blocks 3701, 3702 up to 3706 performs a convolution of the bi-serial input signal by a subset of N filter coefficients plus sub-sampling. Thus, all of the M DDC blocks 3701, 3702 up to 3706 work simultaneously in consecutive windows of length N to jointly carry out the convolution.

The 1.5 bit signal, a bi-serial input signal representing 3 levels (+1, 0, −1), is applied to the DDC blocks 3701, 3702 up to 3706 at inputs 3721, 3722 up to 3726 as a parallel set of a zero-bit signal and a sign-bit signal.

Each one of the consecutive windows comprises N filter coefficients of word length L and N samples of the input signal being aligned in time by the shift registers 3712 up to 3716 being arranged between the signal inputs 3721, 3722 up to 3726 of each of the DDC blocks 3701, 3702 up to 3706.

The convolution plus sub-sampling is executed by multiplying each one of the N filter coefficients by the associated one of the N samples of the input signal and accumulating the resulting products within the window of length N.

Finally, the parallel output signals of all of the M DDC blocks 3701, 3702 up to 3706 have to be added by a pipelined cascade 390 of parallel adder stages. The values for M and N are arbitrary integers, however, the output word length of the DDC blocks should not exceed N.

Figure 13:
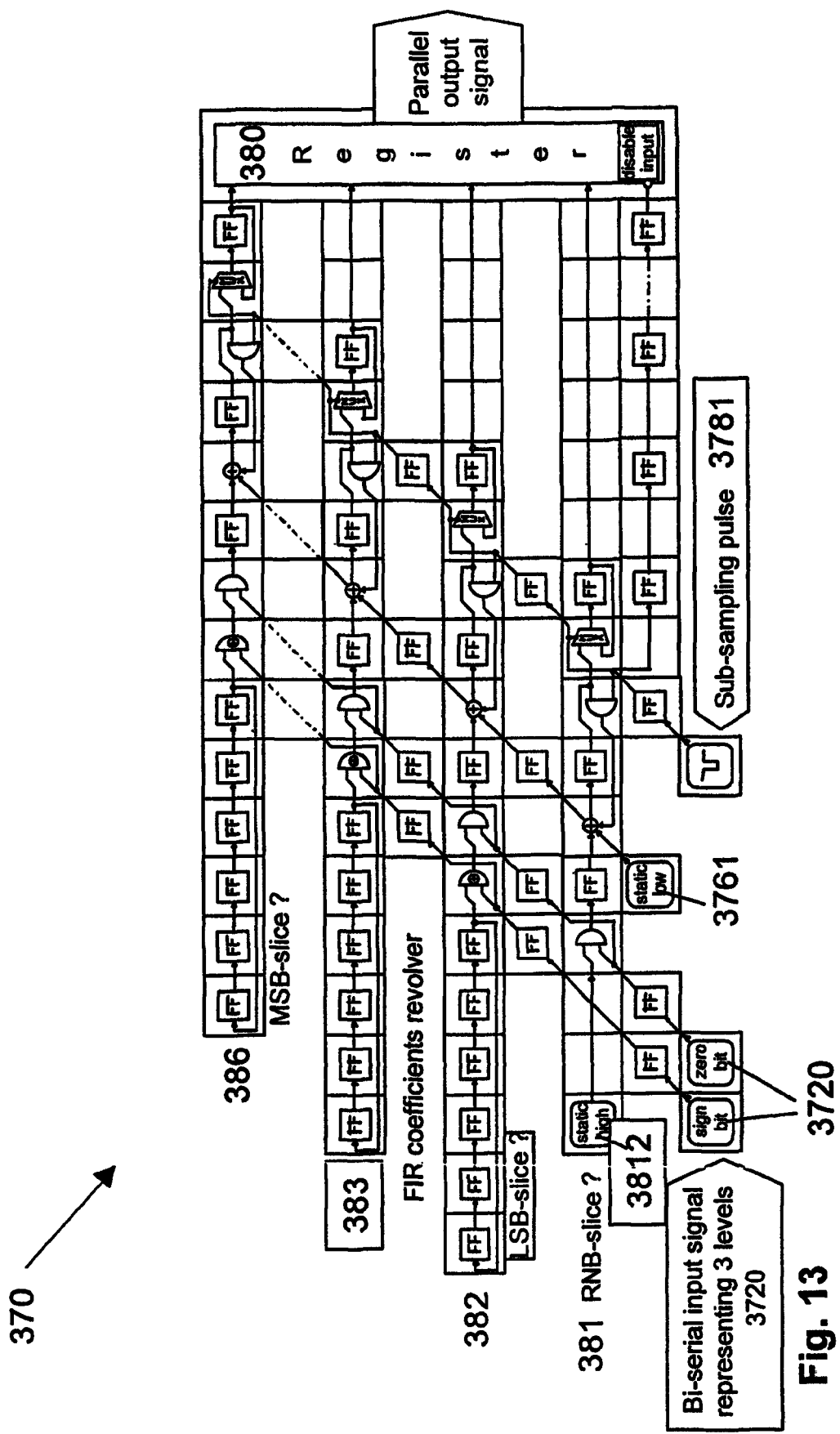
FIG. 13 shows a systolic DDC block realizing N:1 decimation of an 1.5 bit signal
Figure 14:
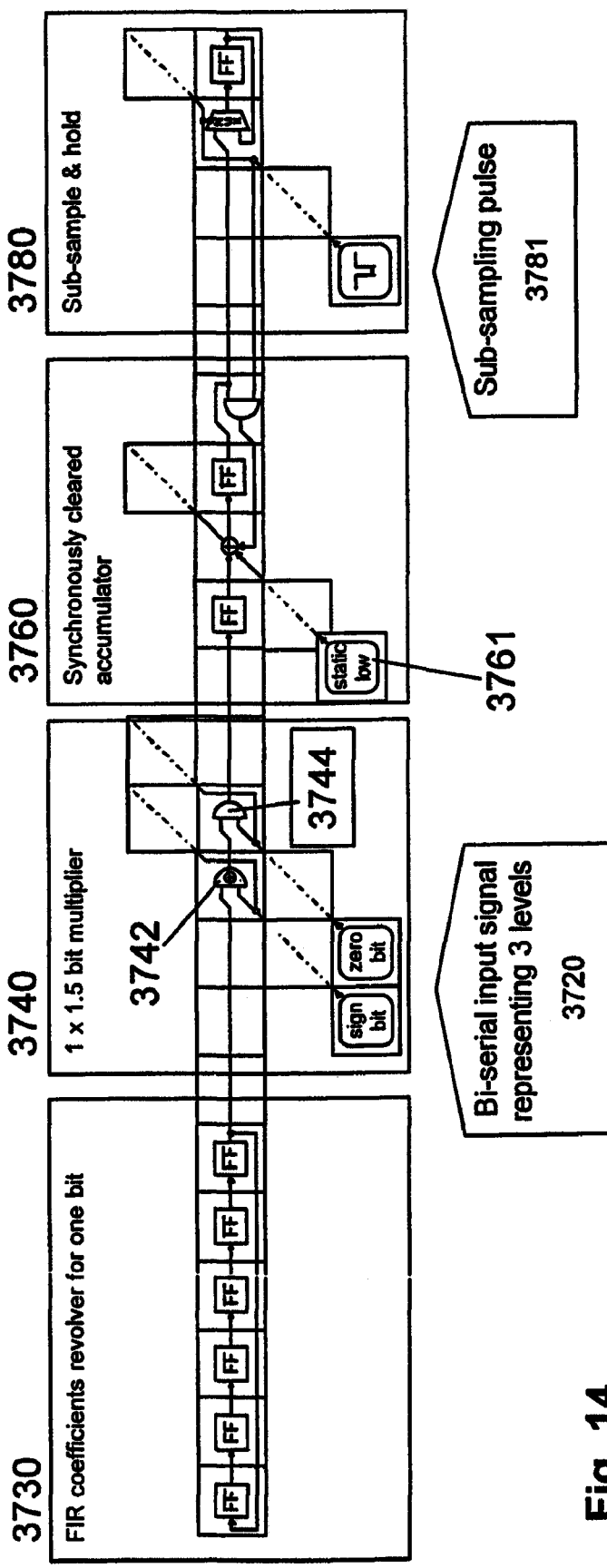
FIG. 14 shows a bit-slice of the convolution unit in a systolic DDC block for N:1. decimation.

FIG. 13 shows the systolic realisation of a DDC block 370 that can be an embodiment of DDC blocks 3701, 3702 up to 3706 of FIG. 12 for N=6. The systolic DDC block 370 realizes a 6:1 decimation of a 1.5 bit signal which represents 3 levels (+1, 0, −1) being coded by 2 bits per sample utilizing two's complement arithmetic. In this context, systolic realisation denotes a 2-dimensional pipelining in the flow direction of the coefficient bits (i.e. "horizontal pipelining") as well as in the flow direction of the carry bits (i.e. "vertical pipelining"). By definition, a "systolic array" comprises only binary logic elements like AND gates, EXOR gates and multiplexers plus one-bit full adders, flip-flops and wiring as depicted in FIGS. 13 and 14.

In two's complement arithmetic always utilized in every embodiment of the teachings disclosed herein, MSB denotes the Most Significant Bit representing the sign of a value A. A is negative when the MSB is set (high state) and positive when the MSB is cleared (low state). LSB denotes the Least Significant Bit representing in a codeword of n bits the value of $2^{-n}$ when the LSB is set (high state).

Furthermore a Representative Notation Bit (RNB) is included following the LSB. The RNB is always set (high state) representing the constant value of $2^{-(n+1)}$. This representative level notation achieved by introducing the RNB is used for enabling a systolic realization of the DDC block 370 because it inhibits the so called "carry ripple through effect". As known in the art, this effect normally occurs when in two's complement arithmetic a codeword is negated. When representative level notation by introducing a RNB is provided a given codeword for A can simply be negated by inverting all the bits from MSB to LSB whilst the RNB remains unchanged.

As depicted in FIG. 13, the systolic DDC Block 370 comprises a convolution plus sub-sampling unit composed of a plurality of L bit-slices 381, 382, 383 up to 386 followed by an output storage register 380 having a parallel output. Usually, L<N bit-slices are arranged in parallel but the teachings disclosed herein are not limited to the number of L<N bit-slices. All flip-flops FFi shown in FIG. 13 and the output storage register 380 are clocked at the sampling rate of the bi-serial input signal 3720 representing 3 levels (+1, 0, −1).

The bit-slices 381, 382, 383 up to 386 jointly perform the convolution plus sub-sampling process by multiplying the bi-serial input signal 3720 sample wise by FIR filter coefficients of word length L (including the RNB) and accumulating the resulting products over N sampling clock pulses. The FIR filter coefficients for each of the bit-slices 382, 383 up to 386 are loaded bit wise into shift registers with feed-back termed 'FIR coefficients revolver' where the coefficient bits are rotated. Within the RNB-slice 381, however, the FIR coefficients revolver and a following EXOR gate are replaced by a static high signal 3812 because the RNB is always set as stated above.

The convolution plus sub-sampling process is running simultaneously in all of the bit-slices 381, 382, 383 up to 386 but mutually delayed due to a vertical pipelining caused by flip-flops FF in the direction from RNB via LSB to MSB. Therefore, the first part of the convolution result per sub-sampling cycle is obtained in the RNB-slice 381 whilst the last part of the convolution result per sub-sampling cycle is obtained L−1 clock pulses later in the MSB-slice 386. Thus, the result of a convolution plus sub-sampling cycle per bit-slice is intermediately stored in a sample & hold flip-flop equipped with feed-back via a multiplexer. This enables a permanently running convolution plus sub-sampling process within anyone of the bit-slices 381, 382, 383 up to 386 without the need to wait until the next bit-slices have finished.

As depicted in FIG. 13 for N=6, a convolution plus sub-sampling cycle is executed per bit-slice after N clock pulses when the sub-sampling pulse 3781 goes low. Finally, all of the intermediately per bit-slice stored results of a total convolution plus sub-sampling cycle calculated with delay by all of the bit-slices 381, 382, 383 up to 386 are taken over in parallel by the output storage register 380 after the MSB-slice 386 has finished its cycle of the convolution and sub-sampling process.

All of the bit-slices 381, 382, 383 up to 386 have the same elements to carry out their respective part of the convolution and sub-sampling process. Within the RNB-slice 381, however, the FIR coefficients revolver and the following EXOR gate are replaced by a static high signal 3812 because the RNB is always set as stated above.

FIG. 14 shows an example of one bit-slice 382, 383 up to 386 of the convolution plus sub-sampling unit within the systolic DDC block 370 in greater detail. As depicted for one bit level and N=6, a bit-slice of the convolution plus sub-sampling unit comprises 4 consecutive functional sub-units. A shift register equipped with feed-back termed 'FIR coefficients revolver' 3730 is loaded with bits of N coefficients being rotated within the FIR coefficients revolver 3730.

The bits of N coefficients are consecutively multiplied in the 1×1.5 bit multiplier unit 3740 by the samples of the bi-serial input signal 3720 representing 3 levels (+1, 0, −1) wherein the 'sign-bit' is set (high state) in case of negative input samples whilst the 'zero-bit' is set for non-zero input samples. The multiplication is simply executed by passing, inhibiting or inverting the coefficient bits using an EXOR gate 3742 and an AND gate 3744. The FIR filter coefficients usually are given in two's complement representative level notation including the RNB (as discussed above). Thus, inverting all of the bits of a given FIR filter coefficient from LSB to MSB performs the negation of the respective coefficient.

The results of these consecutive 1×1.5 bit multiplications are accumulated in a synchronously cleared accumulator 3760 until the sub-sampling pulse 3781 goes low. As depicted in FIG. 4*a*, the sub-sampling pulse 3781 is generated within the receive clock oscillator unit 237 utilizing a synchronous counter which derives the pulse 3781 from the receive clock signal, a method well known in the art.

The sub-sampling pulse 3781 is only in 1 out of N (in the example illustrated here: N=6) consecutive sampling intervals at low state causing at the rising edge of the next clock pulse the take-over of the content of the accumulator 3760 by the following sub-sample & hold stage 3780 whilst the accumulator 3760 is synchronously cleared and the next cycle of the convolution plus sub-sampling process is started immediately. In this arrangement, no extra clearing or read-out cycle is necessary, thus keeping the convolution plus sub-sampling and read-out process straight forward and strictly synchronous.

It should be noted that the RNB of the coefficients being always set is also included in the convolution plus sub-sampling process. This is done by a special RNB-slice 381 wherein the coefficients revolver and the following EXOR gate are replaced by a static high signal 3812.

While various embodiments of the disclosed digital up-converter, down-converter, transceiver, and computer-program product have been described above, it should be understood that they have been presented by way of example, and not limitation. It will be apparent to persons skilled in the relevant arts that various changes in form and detail can be made therein without departing from the scope of what is taught. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the disclosed digital up-converter, down-converter, transceiver, and computer-program product may include methods of providing the apparatus described herein by providing software describing the apparatus and subsequently transmitting the software as a computer data signal over a communication network including the Internet and intranets.

It is understood that the up-converter, down-converter, transceiver, and computer-program product described herein may be included in a semiconductor intellectual property core, such as a microprocessor core (e.g., embodied in HDL) and transformed to hardware in the production of integrated circuits. Additionally, the up-converter, down-converter, transceiver, and computer-program product described herein may be embodied as a combination of hardware and software. Thus, what is taught should not be limited by any of the above-described exemplary embodiments, but should be defined only in accordance with the following claims and their equivalents.

The invention claimed is:

1. A digital up-converter usable in a radio communications system for transmitting digital base-band signals to up-convert an incoming digital base-band signal into a digital band-pass signal, the digital base-band signal comprising an in-phase component and a quadrature component, comprising:
   at least two over-sampling units each comprising a plurality of FIR low-pass filters connected to a sample and hold circuit to over-sample the incoming in-phase component and the incoming quadrature component at an over-sampling ratio of 1/2NT, wherein 1/2NT is an arbitrary integer;
   at least two time-discrete sigma-delta low-pass modulators connected to the over-sampling units to convert the over-sampled in-phase component and the over-sampled quadrature component into a single bit/1.5 bit format which is a bi-serial signal representing three levels as a parallel set of a zero-bit signal and a sign-bit signal, wherein the at least two time-discrete sigma-delta low-pass modulators are resized as systolic arrays;
   at least one quadrature modulation unit for performing quadrature modulations to convert the incoming in-phase component and the incoming quadrature component in single/1.5 bit format into a digital band-pass signal available in single bit format or 1.5 bit format at a output of the digital up-converter.

2. The digital up-converter according to claim 1, wherein the quadrature modulation is performed by 2:1 multiplexing and cyclic negation of the in-phase component and the quadrature component in single/1.5 bit format.

3. The digital up-converter according to claim 1, further comprising at least two SerDes Decoder and Buffer stages to receive the in-phase component and the quadrature component via at least two serial links in a packet data frame format, to convert said in-phase component and quadrature component into at least two parallel synchronous data streams each in a same parallel data format for further processing, and to provide the two parallel synchronous data streams to said at least two over-sampling units.

4. The digital up-converter according to claim 1, further comprising:
   at least one SerDes Decoder and frame buffer plus de-multiplexer stage to receive via at least one serial link, the in-phase component and the quadrature component being interlaced in a packet data frame format and further to de-multiplex, said in-phase component and said quadrature component into at least two parallel synchronous data streams each in a same parallel data format for further processing, and to provide the two parallel synchronous data streams to said at least two over-sampling units.

5. The digital up-converter according to claim 1, wherein the at least one quadrature modulation unit performs quadrature modulation by 2:1 multiplexing and cyclic negation is realized in a pipelined structure by using only 2:1 multiplexers, logic AND and EXOR gates, and flip-flops.

6. The digital up-converter according to claim 1, wherein the digital up-converter utilizes a multi-bit format of the digital band-pass signal.

7. The digital up-converter according to claim 1, wherein the digital up-converter is monolithically micro-electronically integrated or integrated as a multi-chip module.

8. A computer program product embodied on a non-transitory computer-readable medium and comprising executable instructions to up-convert a digital signal using of the digital up-converter of claim 1.

9. The digital up-converter according to claim 3, wherein the digital up-converter utilizes as parallel data format a 16 bit format.

* * * * *

UNITED STATES PATENT AND TRADEMARK OFFICE
CERTIFICATE OF CORRECTION

| | | |
|---|---|---|
| PATENT NO. | : 8,300,724 B2 | Page 1 of 1 |
| APPLICATION NO. | : 12/339293 | |
| DATED | : October 30, 2012 | |
| INVENTOR(S) | : Rheinfelder et al. | |

It is certified that error appears in the above-identified patent and that said Letters Patent is hereby corrected as shown below:

Column 20, Claim 1, line 19, "pass modulators are resized as"
                              should read -- pass modulators are realized as --;

Column 22, Claim 8, line 3, "a digital signal using of the digital"
                              should read -- a digital signal using the digital --;

Signed and Sealed this
First Day of January, 2013

David J. Kappos
*Director of the United States Patent and Trademark Office*